(12) United States Patent
Katayama et al.

(10) Patent No.: US 12,224,033 B2
(45) Date of Patent: Feb. 11, 2025

(54) MEMORY SYSTEM

(71) Applicant: Kioxia Corporation, Tokyo (JP)

(72) Inventors: Akira Katayama, Yokohama Kanagawa (JP); Kosuke Hatsuda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 167 days.

(21) Appl. No.: 18/178,135

(22) Filed: Mar. 3, 2023

(65) Prior Publication Data

US 2023/0410853 A1    Dec. 21, 2023

(30) Foreign Application Priority Data

Jun. 21, 2022    (JP) .................................. 2022-099719

(51) Int. Cl.
  *G11C 7/06*    (2006.01)
  *G11C 5/06*    (2006.01)
  *G11C 7/10*    (2006.01)

(52) U.S. Cl.
  CPC .............. *G11C 7/067* (2013.01); *G11C 5/063* (2013.01); *G11C 7/1069* (2013.01)

(58) Field of Classification Search
  CPC ....... G11C 7/067; G11C 5/063; G11C 7/1069; G11C 11/1673; G11C 11/1693; G11C 2013/0045; G11C 2013/0057; G11C 13/0061; G11C 13/004; G11C 27/024; G11C 5/02; G11C 7/06; G11C 7/12; G11C 7/18; G11C 8/08; G11C 8/14
  USPC ................................................... 365/185.21
  See application file for complete search history.

(56) References Cited

U.S. PATENT DOCUMENTS

| | | | |
|---|---|---|---|
| 7,782,661 B2 | 8/2010 | Yang | |
| 9,142,271 B1 | 9/2015 | Srinivasan et al. | |
| 2021/0027829 A1* | 1/2021 | Kim | G11C 13/003 |
| 2021/0027835 A1* | 1/2021 | Lee | G11C 13/0026 |
| 2021/0295888 A1 | 9/2021 | Osada et al. | |

(Continued)

FOREIGN PATENT DOCUMENTS

| | | | | |
|---|---|---|---|---|
| CN | 113270123 A | * | 8/2021 | ........ G06F 11/0727 |
| CN | 113889166 A | * | 1/2022 | |
| JP | 5571096 B2 | | 7/2014 | |

(Continued)

OTHER PUBLICATIONS

Im (Year: 2021).*

(Continued)

*Primary Examiner* — Fernando Hidalgo
(74) *Attorney, Agent, or Firm* — Holtz, Holtz & Volek PC

(57) ABSTRACT

A memory system according to an embodiment includes a plurality of first wirings, a plurality of second wirings, a memory cell, a third wiring, a sense amplifier, a first switching element, a first transistor including a first terminal connected to a first node and a second terminal connected to a second node, and a control circuit. The first node is positioned further to the side of the sense amplifier than the first switching element. The second node is positioned further to the memory cell than the first switching element. The control circuit is configured to connect the first node and the second node when the first switching element is in an ON state, and connect the first node and the gate terminal of the first transistor when the first switching element is in an OFF state.

10 Claims, 26 Drawing Sheets

(56) References Cited

U.S. PATENT DOCUMENTS

2023/0290408 A1* 9/2023 Kobayashi .......... G11C 11/1673

FOREIGN PATENT DOCUMENTS

| | | | |
|---|---|---|---|
| JP | 6614726 B2 | 11/2019 | |
| JP | 2021150497 A | 9/2021 | |
| TW | 202147310 A | * 12/2021 | ........... G11C 11/412 |

OTHER PUBLICATIONS

Hirano (Year: 2022).*
Yabuuchi (Year: 2021).*
U.S. Appl. No. 17/684,502, First Named Inventor: Akira Katayama; Title: "Memory System", filed Mar. 2, 2022.

* cited by examiner

D3

MEMORY SYSTEM

CROSS REFERENCE TO RELATED APPLICATIONS

This application claims the benefit of priority to Japanese Patent Application No. 2022-099719, filed on Jun. 21, 2022, the entire contents of which are incorporated herein by reference.

FIELD

Embodiments described herein relate generally to a memory system including a storage device.

BACKGROUND

A memory system including a storage device in which a resistance change type memory element or the like is integrated on a semiconductor substrate has been proposed.

DESCRIPTION OF EMBODIMENTS

Figure 1:
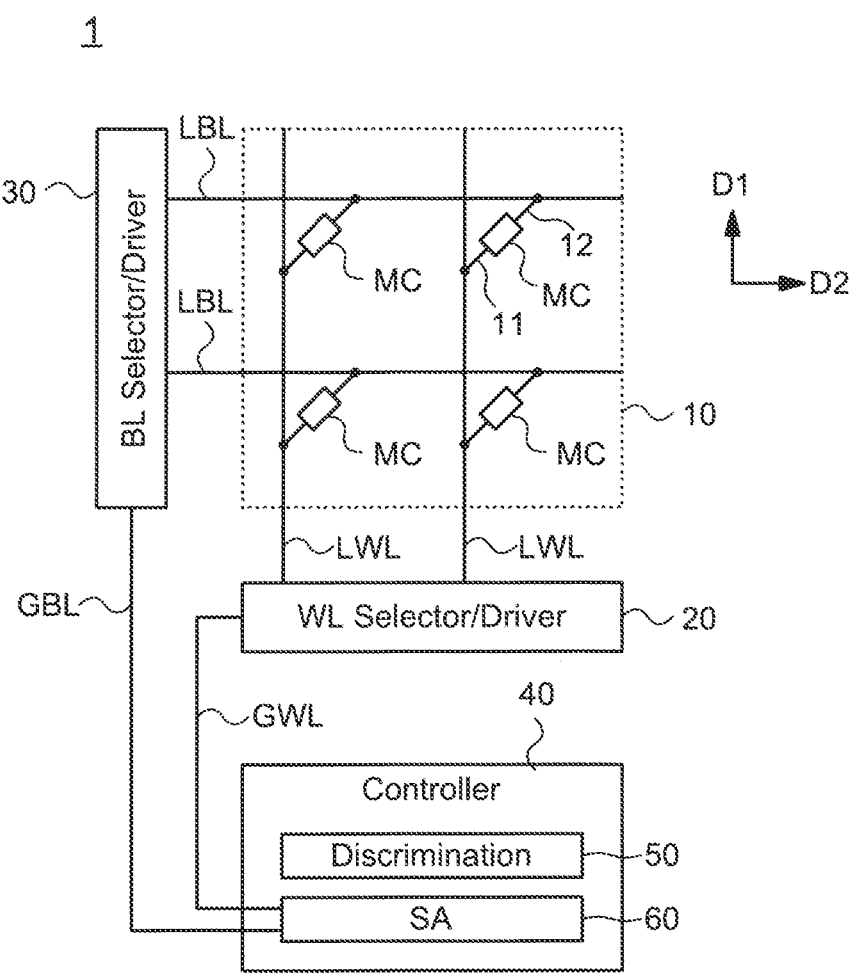
FIG. 1 is a block diagram illustrating an overall configuration of a memory system according to an embodiment.

A memory system according to present embodiments is provided in which it is possible to perform a high-speed read operation.

A memory system according to an embodiment includes a plurality of first wirings extending in a first direction; a plurality of second wirings extending in a second direction intersecting the first direction; a memory cell connected to the first wiring and the second wiring between the first wiring and the second wiring in a position where the first wiring and the second wiring intersect in a view of a third direction perpendicular with respect to a plane including the first direction and the second direction; a third wiring connectable to each of the plurality of first wirings; a sense amplifier connected to the third wiring, the sense amplifier being configured to execute a read operation to the memory cell; a first switching element between the plurality of first wirings and the third wiring; a first transistor including a first terminal, a second terminal and a gate terminal, the first terminal being connected to a first node on a wiring connecting the first wiring and the third wiring, the second terminal being connected to a first power source line, the gate terminal being connected to a second node on a wiring connecting the first wiring and the third wiring; and a control circuit. The first node is positioned further to the side of the sense amplifier than the first switching element. The second node is positioned further to the side of the memory cell than the first switching element. The control circuit is configured to connect the first node and the second node when the first switching element is in an ON state, and connect the first node and the gate terminal of the first transistor when the first switching element is in an OFF state.

Hereinafter, a nonvolatile semiconductor memory device according to the present embodiments will be described in detail with reference to the drawings. In the following description, elements having substantially same functions and configurations are denoted by the same reference numerals, and will be described redundantly only if necessary. Each of the embodiments described below exemplifies an apparatus and a method for embodying technical ideas of this embodiment. The technical ideas of the embodiments are not to specify materials, shapes, structures, arrangements, or the like of component parts to those elements described herein. Various modifications may be made to the technical ideas of the embodiments with respect to claims.

In the embodiments of the present disclosure, a direction from a variable resistance element 101 toward a switching element 102 is referred to as "on" or "above". Conversely, a direction from the switching element 102 toward the variable resistance element 101 is referred to as "under" or "below". As described above, for convenience of explanation, although an explanation is provided using the phrase "above" or "below", for example, the variable resistance element 101 and the switching element 102 may be arranged such that a vertical relationship thereof is opposite to that shown in the figures. In the following descriptions, for example, an expression of the switching element 102 above the variable resistance element 101 merely describes the vertical relationship between the variable resistance element 101 and the switching element 102 as described above, and other members may be disposed between the variable resistance element 101 and the switching element 102. The term "upper" or "lower" means a stacking order in a structure in which a plurality of layers are stacked. A positional relationship in which a word line WL and a bit line BL do not overlap each other in a plan view may be used in the case of expressing the bit line BL being above the word line WL. On the other hand, a case of expressing the bit line BL being vertically above the word line WL means a positional relationship in which the word line WL and the bit line BL overlap each other in a plan view.

As used herein, phrases "α comprises A, B or C", "α comprises any of A, B and C", "α comprises one selected from a group consisting of A, B and C" and the like does not exclude cases where a comprises a plurality of combinations of A to C unless otherwise indicated. Furthermore, these expressions do not exclude a case where a includes other elements.

In the following explanations, although "voltage" refers to a potential difference between two terminals, "voltage" may also refer to a potential based on a voltage VSS or a ground voltage.

1. First Embodiment

A memory system according to a first embodiment will be described with reference to FIG. 1 to FIG. 13. For example, a memory system 1 according to the first embodiment includes a memory cell array 10 in which a plurality of memory cells MC are arranged, and a control circuit 40 for controlling the memory cells.
[1-1. Overall Configuration of Memory System]

An overall configuration of the memory system according to the first embodiment will be described with reference to FIG. 1. FIG. 1 is a block diagram illustrating an overall configuration of a memory system according to an embodiment. As illustrated in FIG. 1, the memory system 1 includes the memory cell array 10, a word line selection/driving circuit 20 (WL Selector/Driver), a bit line selection/driving circuit 30 (BL Selector/Driver), and the control circuit 40 (Controller).

The memory cell array 10 is provided with the plurality of memory cells MC, a plurality of local word lines LWL, and a plurality of local bit lines LBL. Each of the local word lines LWL extends in a direction D1. Each of the local bit lines LBL extends in a direction D2. Each of the memory cells MC is provided between one of the local word lines LWL and one of the local bit lines LBL, and is electrically connected to the local word line LWL and the local bit line LBL. The memory cell MC is a two-terminal memory cell. A first terminal 11 of the memory cell MC is connected to the local word line LWL. A second terminal 12 of the memory cell MC is connected to the local bit line LBL. The local word line LWL and the local bit line LBL intersect each other, which will be described later. The memory cell MC is provided at a position where the local word line LWL and the local bit line LBL intersect each other.

FIG. 1 illustrates a configuration in which the direction D1 and the direction D2 are perpendicular to each other. However, the direction D1 and the direction D2 may intersect each other at an angle where they are not perpendicular to each other. FIG. 1 illustrates a configuration in which the local word line LWL extends linearly in the direction D1. However, the local word line LWL may not be linear. The local word line LWL may extend in the direction D1 in the case where the entire local word line LWL is viewed. FIG. 1 illustrates a configuration in which the local bit line LBL extends linearly in the direction D2. However, the local bit line LBL may not be linear. The local bit line LBL may extend in the direction D2 in the case where the entire local bit line LBL is viewed.

A memory cell MC to be subjected to a write operation and a read operation is designated by selecting one local word line LWL and one local bit line LBL from the plurality of local word lines LWL and the plurality of local bit lines LBL. Specifically, a predetermined current flows through the memory cell MC by applying a predetermined voltage to a specific local word line LWL and the local bit line LBL. The write operation and the read operation are performed on the memory cell MC by flowing the predetermined current through the memory cell MC. In the following explanations, the read operation with respect to the memory cell MC can be referred to as a "sense operation" or a "sense amplifier operation".

The word line selection/driving circuit 20 is provided at a position adjacent to the memory cell array 10 in the direction D1. The local word lines LWL are connected to the word line selection/driving circuit 20.

The bit line selection/driving circuit 30 is provided at a position adjacent to the memory cell array 10 in the direction D2. The local bit lines LBL are connected to the bit line selection/driving circuit 30.

The control circuit 40 is connected to the word line selection/driving circuit and the bit line selection/driving circuit 30. The control circuit 40 includes a discrimination circuit 50 (Discrimination) and a sense amplifier 60 (SA). The control circuit 40 is connected to the word line selection/driving circuit 20 via a global word line GWL, and is connected to the bit line selection/driving circuit 30 via a global bit line GBL. More specifically, the global word line GWL and the global bit line GBL are connected to the sense amplifier 60. As will be described later, the sense amplifier 60 performs the read operation on the memory cell MC.

The control circuit 40 executes the write operation and the read operation in response to a command. The control circuit 40 supplies a control signal to the word line selection/driving circuit 20 and the bit line selection/driving circuit 30 in accordance with an address designated in the write operation and the read operation. The word line selection/driving circuit 20 and the bit line selection/driving circuit 30 select a local word line LWL and a local bit line LBL corresponding to a specified addresses, respectively, in accordance with the control signal. The word line selection/driving circuit 20 and the bit line selection/driving circuit 30 apply a write voltage or a read voltage to the selected local word line LWL and the local bit line LBL, respectively.

In the present embodiment, although a configuration in which one global word line GWL and one global bit line GBL are connected to the control circuit 40 is illustrated, the configuration is not limited to this configuration. For example, a plurality of global word lines GWL and a plurality of global bit lines GBL may be connected to the control circuit 40. The plurality of global word lines GWL and the plurality of global bit lines GBL may be connected to different memory cell arrays 10, respectively.

The global word line GWL is connectable to the plurality of local word lines LWL. The global bit line GBL is connectable to the plurality of local bit lines LBL.

The discrimination circuit 50 discriminates a data value stored in the memory cell MC based on the voltage (the read voltage) of the memory cell MC obtained by the read operation. As will be described later, the memory cell MC includes the variable resistance element 101 and stores binary data depending on a resistance state (a low resistance state or a high resistance state) of the variable resistance element 101. The data stored in the memory cell MC is discriminated by discriminating a resistance of the variable resistance element 101 being discriminated by the discrimination circuit 50.

[1-2. Configuration of Memory Cell Array 10]

Figure 2:
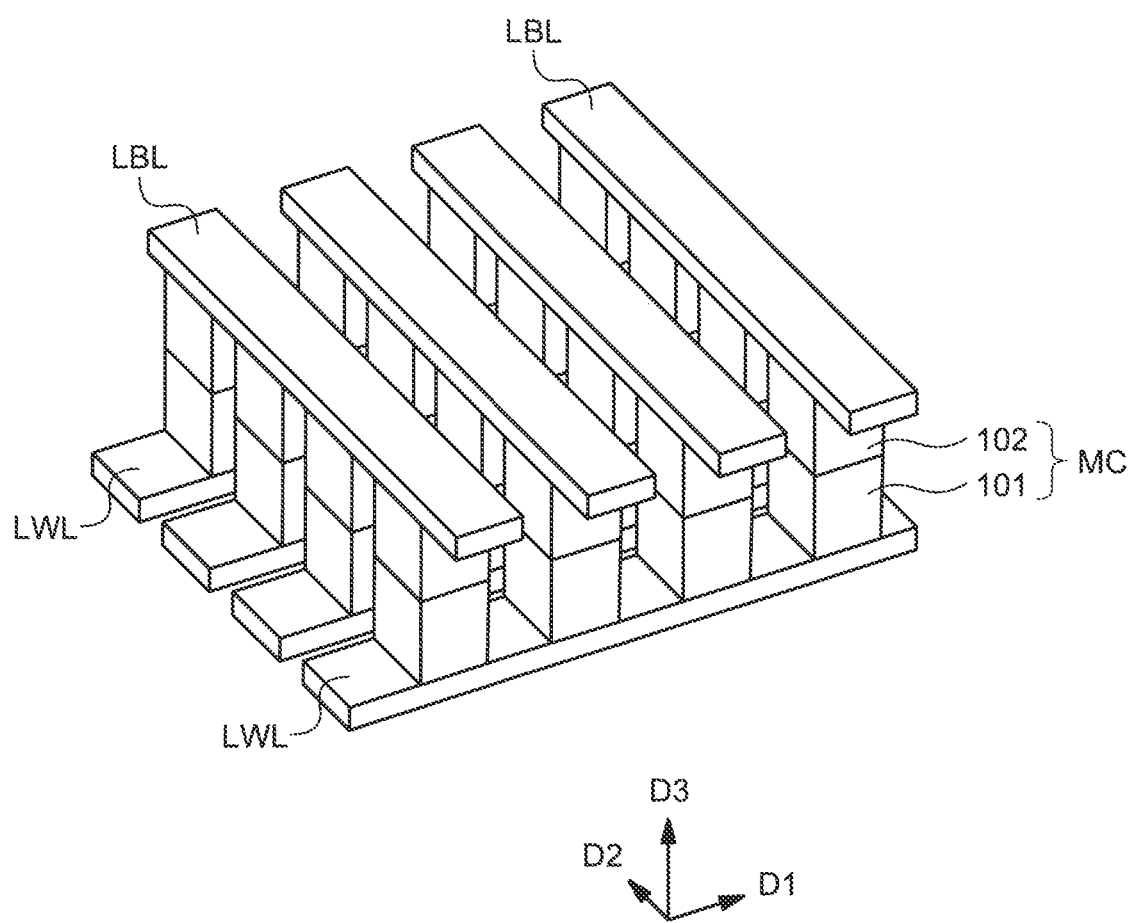
FIG. 2 is a perspective view schematically illustrating a configuration of a memory cell according to an embodiment.

FIG. 2 is a perspective view schematically illustrating a configuration of a memory cell according to an embodiment. As shown in FIG. 2, the memory cell MC is provided above (direction D3) the local word line LWL. The local bit line LBL is provided above (direction D3) the memory cell MC. In other words, the memory cell MC is provided between the local word line LWL and the local bit line LBL in regions where the local word line LWL and the local bit line LBL intersect in a view of direction D3 each other. The direction D3 is a direction perpendicular with respect to a plane including the directions D1 and D2.

The memory cell MC includes the variable resistance element 101 and the switching element 102. The variable resistance element 101 and the switching element 102 are connected in series between the local word line LWL and the local bit line LBL. The variable resistance element 101 is provided on a side of the local word line LWL. The switching element 102 is provided on a side of the local bit line LBL.

The variable resistance element 101 is a nonvolatile memory element that can be switched to the low resistance state or the high resistance state. The low resistance state of the variable resistance element 101 may be referred to as a "first low resistance state". The high resistance state of the variable resistance element 101 may be referred to as a "first high resistance state". In the present embodiment, a configuration in which a magnetoresistive element including a magnetic tunnel junction (MTJ) is used as the variable resistance element 101 will be described. Hereinafter, the magnetoresistive element may be referred to as a "MTJ element". The MTJ element is a memory element in which a resistance (a tunnel resistance) due to a tunnel effect in an insulating layer changes depending on a relationship (parallel or non-parallel) between a magnetization directions of two magnetic layers adjacent to each other via the insulating layer. That is, the MTJ element includes a plurality of resistive states (resistive values) according to the relative relationship (magnetization arrangement) between the direction of the magnetization of one magnetic layer and the direction of the magnetization of another magnetic layer.

The switching element 102 is a two-terminal element. The switching element is switched to a low resistance state or a high resistance state in accordance with a voltage applied to the two terminals. The low resistance state of the switching element 102 may be referred to as a "second low resistance state". The high resistance state of the switching element 102 may be referred to as a "second high resistance state". A resistance in the second low resistance state is lower than a resistance in the first low resistance state of the variable resistance element 101 mentioned above. A resistance in the second high resistance state is higher than a resistance in the first high resistance state of the variable resistance element 101 mentioned above. That is, in the case where the switching element 102 is in the second high resistance state, a resistance of the memory cell MC is substantially determined by a resistance of the switching element 102. On the other hand, in the case where the switching element 102 is in the second low resistance state, the resistance of the memory cell MC is substantially determined by the resistance of the variable resistance element 101.

Unlike the configuration of FIG. 2, the variable resistance element 101 may be provided on a side of the local bit line LBL. The switching element 102 may be provided on a side of the local word line LWL. The local word line LWL may be provided above (direction D3) the switching element 102. The local bit line LBL may be provided below (opposite to the direction D3) the variable resistance element 101. Other members may be provided between the local word line LWL and the variable resistance element 101. Similarly, other members may be provided between the local bit line LBL and the switching element 102.

In the present embodiment, although a configuration in which the MTJ element is used as the variable resistance element 101 is described, a variable resistance element other than the MTJ element may be used as the variable resistance element 101. For example, the variable resistance element 101 may be a resistance change type memory element (ReRAM), a ferroelectric memory (FeRAM), an organic memory, or a phase change memory element (PRAM).

[1-3. Configuration of MTJ Element]

Figure 3:
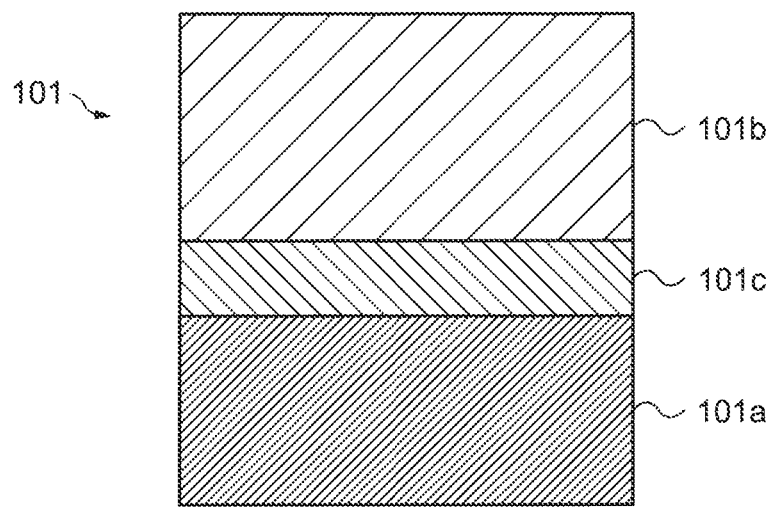
FIG. 3 is a cross-sectional view schematically illustrating a configuration of a variable resistance element according to an embodiment.
Figure 3:

FIG. 3 is a cross-sectional view schematically illustrating a configuration of a variable resistance element according to an embodiment. As illustrated in FIG. 3, the MTJ element used as the variable resistance element 101 includes a storage layer 101*a*, a reference layer 101*b*, and a tunnel barrier layer 101*c*. The storage layer 101*a* is a ferromagnetic layer having a first magnetic property. The reference layer 101*b* is a ferromagnetic layer having a second magnetic property. The tunnel barrier layer 101*c* is a nonmagnetic layer. A magnetization direction of the storage layers 101*a* is variable. A magnetization direction of the reference layer 101*b* is fixed. A write current supplied to the storage layer 101*a* changes the magnetization direction of the storage layer 101*a*. A direction of the write current determines the magnetizing direction of the storage layers 101*a*. On the other hand, even if the write current is supplied to the reference layer 101*b*, the magnetization direction of the reference layer 101*b* does not change. The tunnel barrier layer 101*c* is an insulating layer. The expression "the magnetization direction is variable" means that the magnetization direction can be changed before the write current is supplied (before writing) and after the write current is supplied (after writing). "The magnetization direction is fixed" means that the magnetization direction does not change before the write current is supplied (before writing) and after the write current is supplied (after writing).

In the case where the magnetization direction of the storage layer 101*a* is parallel to the magnetization direction of the reference layer 101*b* (in the case where the magnetization direction is the same direction), the MTJ element is in a low resistance state. In the case where the magnetization direction of the storage layer 101*a* is antiparallel to the magnetization direction of the reference layer 101*b* (in the case where the magnetization direction is the opposite direction), the MTJ element is in the high resistance state. As described above, since the resistance state (the low resistance state or the high resistance state) is controlled according to the magnetization direction of the storage layers 101a, the MTJ element can store different binary data based on the resistance state.

Although FIG. 3 illustrates a configuration in which a bottom-free type MTJ element in which the storage layer 101a is provided below the reference layer 101b is used as the variable resistance element 101, the configuration is not limited to this configuration. As the variable resistance element 101, a top-free type MTJ element in which the storage layer 101a is provided above the reference layer 101b may be used. The MTJ element may further include a shift canceling layer that cancels a magnetic field applied from the reference layer 101b to the storage layer 101a.

[1-4. Electrical Properties of Switching Element]

Figure 4:
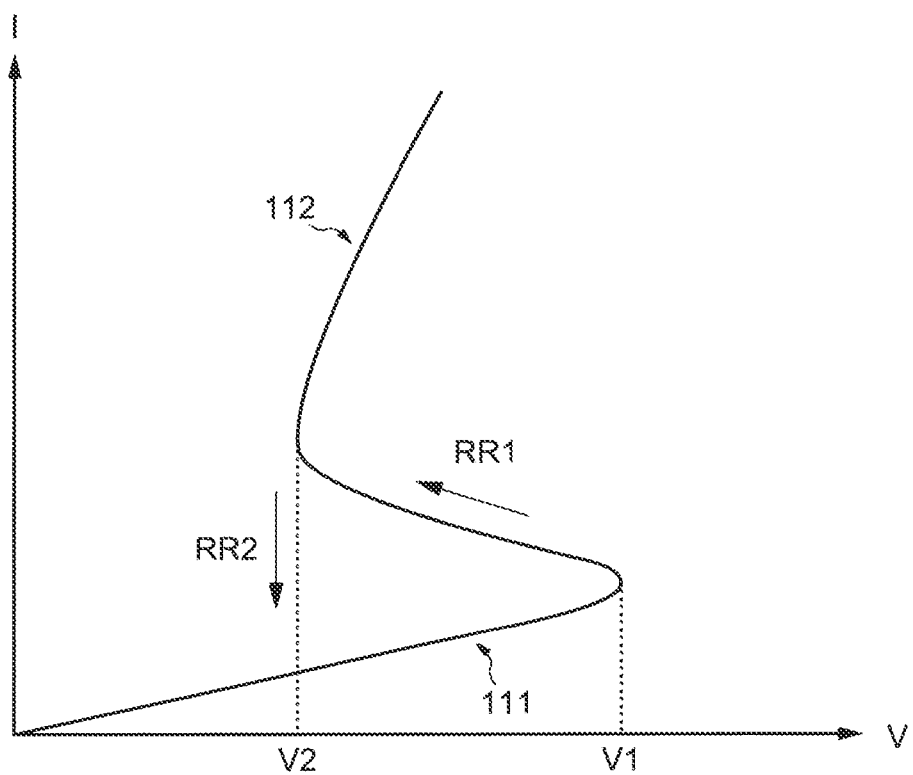
FIG. 4 is a diagram illustrating electrical properties of a switching element according to an embodiment.

FIG. 4 is a diagram illustrating electrical properties of a two-terminal type switching element according to an embodiment. As shown in FIG. 4, the switching element 102 is switched from a high resistance state 111 to a low resistance state 112 if the voltage applied between the two terminals is increased to reach a first voltage V1. The switching element 102 has a property that when the switching element 102 is switched to the low resistance state 112, the voltage between the two terminals shifts to a second voltage V2 lower than the first voltage V1, and a current rapidly increases. Further, the switching element 102 has a property that when a voltage applied between the two terminals is decreased and reaches the second voltage V2, the switching element 102 is switched from the low resistance state 112 to the high resistance state 111. That is, the switching element 102 follows a negative resistance region between the voltage V1 and the voltage V2 when switched from the high resistance state 111 to the low resistance state 112 (an arrow RR1), but transitions to the high resistance state 111 without following the negative resistance region when switched from the low resistance state 112 to the high resistance state 111 (an arrow RR2). The switching element 102 has electrical properties symmetrical to each other in both directions (positive direction and negative direction) with respect to the original coordinates.

As an example, the switching element 102 of the present embodiment has a property that, when an applied voltage reaches the voltage V1 as described above, a resistance value of the switching element 102 decreases rapidly, and accordingly, the applied voltage decreases rapidly to the voltage V2 and a current increases (snaps back). The switching element 102 of the present embodiment is the two-terminal type switching element. Material compositions used for the switching element having such properties are appropriately selected in accordance with properties of a memory cell.

The write operation and the read operation for the variable resistance element 101 can be performed by applying a predetermined voltage between the local word line LWL and the local bit line LBL and switching the switching element 102 to the low resistance state.

[1-5. Electrical Properties of Memory Cell MC]

Figure 5:
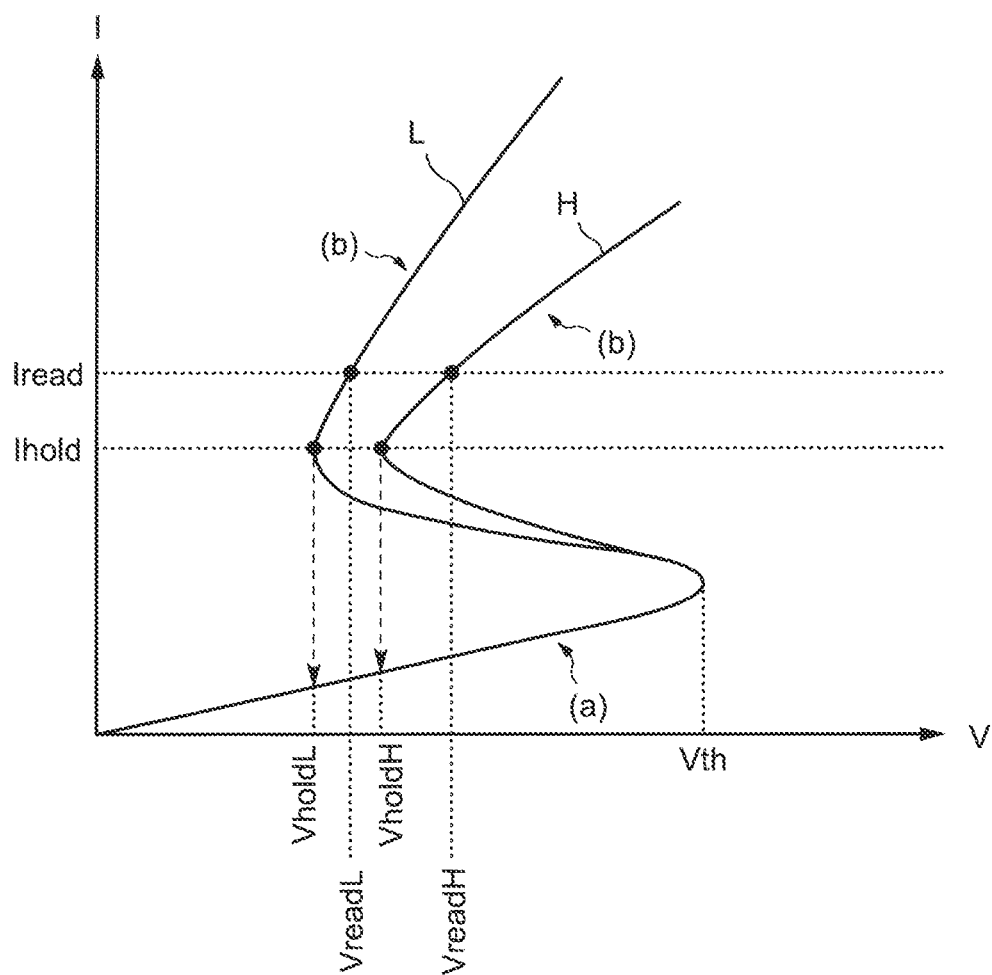
FIG. 5 is a diagram illustrating electrical properties during a read operation of the memory cell according to an embodiment.

FIG. 5 is a diagram schematically illustrating electric properties of a selected memory cell MC during the read operation. In FIG. 5, the horizontal axis represents a voltage between two terminals of the selected memory cell MC (a voltage applied between the local word line LWL and the local bit line LBL), and the vertical axis represents a current flowing through the selected memory cell MC. A property (L) is a property when the variable resistance element 101 is in the low resistance state. A property (H) is a property when the variable resistance element 101 is in the high resistance state.

As described above, the resistance of the switching element 102 in the high resistance state is higher than the resistance of the variable resistance element 101 in the high resistance state. Here, the resistance of the memory cell MC is substantially determined by the resistance of the switching element 102. Therefore, the electric properties (corresponding to the property part (a)) of the memory cell MC before the switching element 102 is switched from the high resistance state to the low resistance state are substantially the same even in the case where the variable resistance element 101 is in the low resistance state or in the high resistance state. That is, a voltage (a threshold voltage Vth) applied between the two terminals of the memory cell MC when the switching element 102 is switched from the high resistance state to the low resistance state is substantially the same even in the case where the switching element 102 is in the low resistance state or in the high resistance state.

On the other hand, since the resistance of the switching element 102 in the low resistance state is lower than the resistance of the variable resistance element 101 in the low resistance state, the resistance of the memory cell MC is substantially determined by the resistance of the variable resistance element 101 after the switching element 102 is switched from the high resistance state to the low resistance state. Therefore, with respect to the electrical properties (corresponding to the property part (b)) of the memory cell MC after the switching element 102 is switched from the high resistance state to the low resistance state, the electrical properties in the case where the variable resistance element 101 is in the low resistance state differ from the electrical properties in the case where the variable resistance element 101 is in the high resistance state. Specifically, with respect to gradients of voltage-current in the property portion (b), the gradient in the case where the variable resistance element 101 is in the high resistance state is smaller than the gradient in the case where the variable resistance element 101 is in the low resistance state.

As shown in FIG. 5, with respect to a read current !read in the read operation, a read voltage in the case where the variable resistance element 101 is in the low resistance state is VreadL, and a read voltage in the case where the variable resistance element 101 is in the high resistance state is VreadH. The read voltage VreadL is smaller than the read voltage VreadH. Based on a difference between the read voltage VreadL and the read voltage VreadH, the resistance state (low resistance state or high resistance state) of the variable resistance element 101 can be discriminated.

In FIG. 5, a hold current !hold is a current flowing through the memory cell MC when the switching element 102 is switched from the low resistance state to the high resistance state. A hold voltage Vhold is a voltage applied between two terminals of the memory cell MC when the hold current !hold flows through the memory cell MC. In the case where the variable resistance element 101 is in the low resistance state, the hold voltage is VholdL. In the case where the variable resistance element 101 is in the high resistance state, the hold voltage is VholdH. If the hold voltage VholdL and the hold voltage VholdH are not specifically distinguished, they are simply referred to as hold voltages Vhold.

[1-6. Functional Configuration of Discrimination Circuit]

Figure 6:
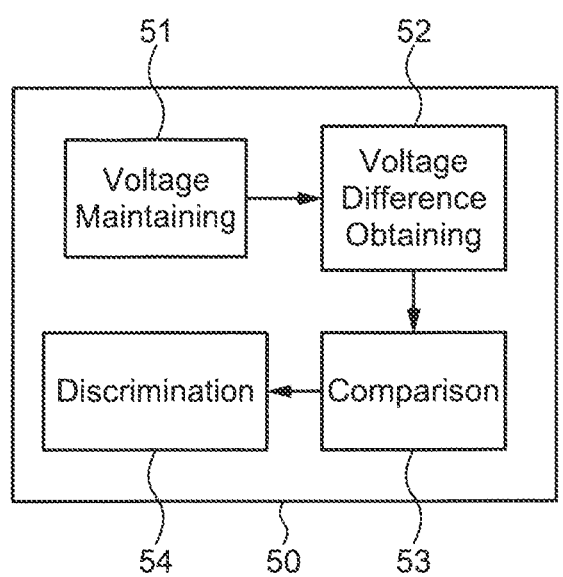
FIG. 6 is a block diagram illustrating a functional configuration of a discrimination circuit included in the memory system according to an embodiment.

FIG. 6 is a block diagram illustrating a functional configuration of a discrimination circuit included in the memory system according to an embodiment. As illustrated in FIG. 6, the discrimination circuit 50 includes a voltage maintaining unit 51 (Voltage Maintaining), a voltage difference obtaining unit 52 (Voltage Difference Obtaining), a comparison unit 53 (Comparison), and a discrimination unit 54 (Discrimination).

The voltage maintaining unit 51 holds the read voltage (VreadL or VreadH) obtained by the read operation of the memory cell MC as a discrimination target voltage. As described above, the read operation of the data stored in the memory cell MC may be referred to as a "first read operation". The discrimination target voltage may be referred to as a "first target voltage".

Further, the voltage maintaining unit 51 holds a reference voltage for performing data discrimination on the discrimination target voltage. The reference voltage is obtained by a second read operation performed after the first read operation. The reference voltage may be referred to as a "second target voltage". After the first read operation, the write operation to the variable resistance element 101 is performed. The second read operation is performed after the variable resistance element 101 is switched to the low resistance state or the high resistance state by the write operation. The resistance state of the variable resistance element 101 when the first read operation is performed may be referred to as a "discrimination target resistance state". The resistance state of the variable resistance element 101 when the second read operation is performed may be referred to as a "reference resistance state".

The voltage difference obtaining unit 52 obtains a voltage difference between the discrimination target voltage held by the voltage maintaining unit 51 and the reference voltage.

The comparison unit 53 compares the voltage difference obtained by the voltage difference obtaining unit 52 with a reference voltage difference. The reference voltage difference is, for example, a value obtained by multiplying the voltage difference between the read voltage VreadL in the case where the variable resistance element 101 is in the low resistance state and the read voltage VreadH in the case where the variable resistance element 101 is in the high resistance state by ½.

The discrimination unit 54 discriminates the resistance state of the variable resistance element 101 based on a comparison result obtained by the comparison unit 53. Specifically, in the case where a voltage difference between the discrimination target voltage and the reference voltage is smaller than the reference voltage difference, it is discriminated that the discrimination target resistance state of the variable resistance element 101 is the same resistance state as the reference resistance state. In the case where the voltage difference between the discrimination target voltage and the reference voltage is larger than the reference voltage difference, it is discriminated that the discrimination target resistance state of the variable resistance element 101 is a resistance state different from the reference resistance state.

[1-7. Principle of Read Operation]

Figure 7:
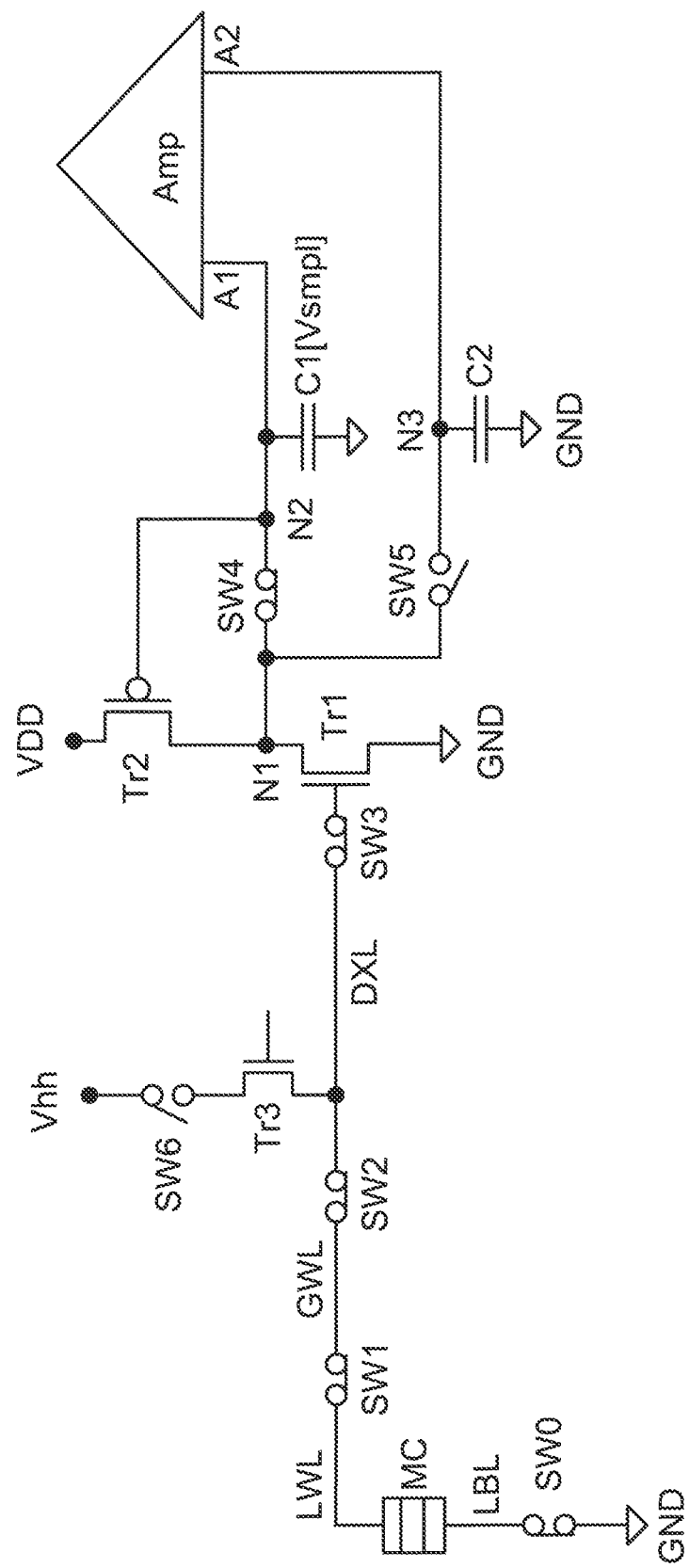
FIG. 7 is a circuit diagram for explaining a principle of the read operation of the memory system according to the embodiment.
Figure 8:
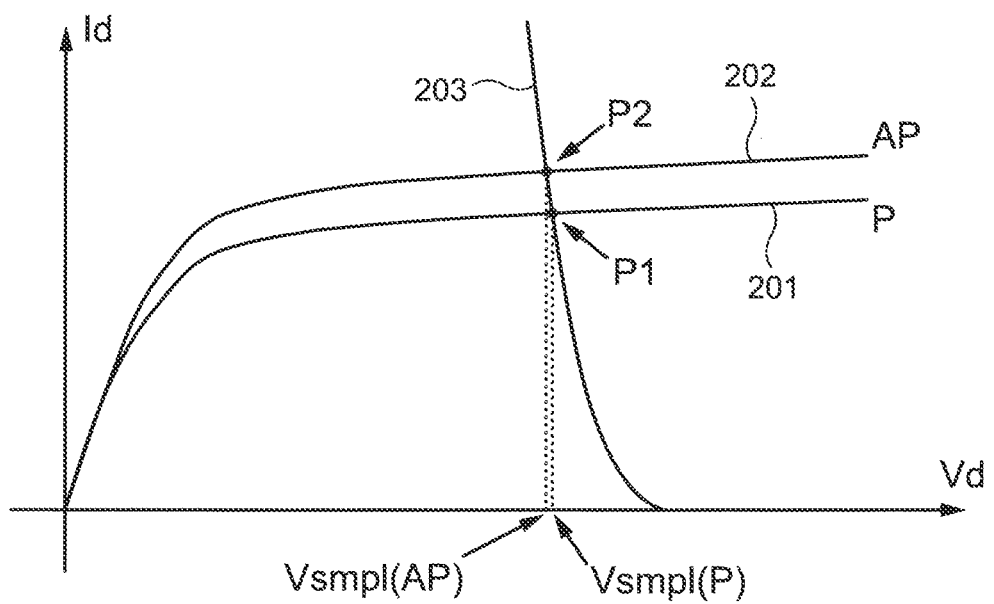
FIG. 8 is a diagram for explaining a principle of the read operation of the memory system according to an embodiment.
Figure 9:
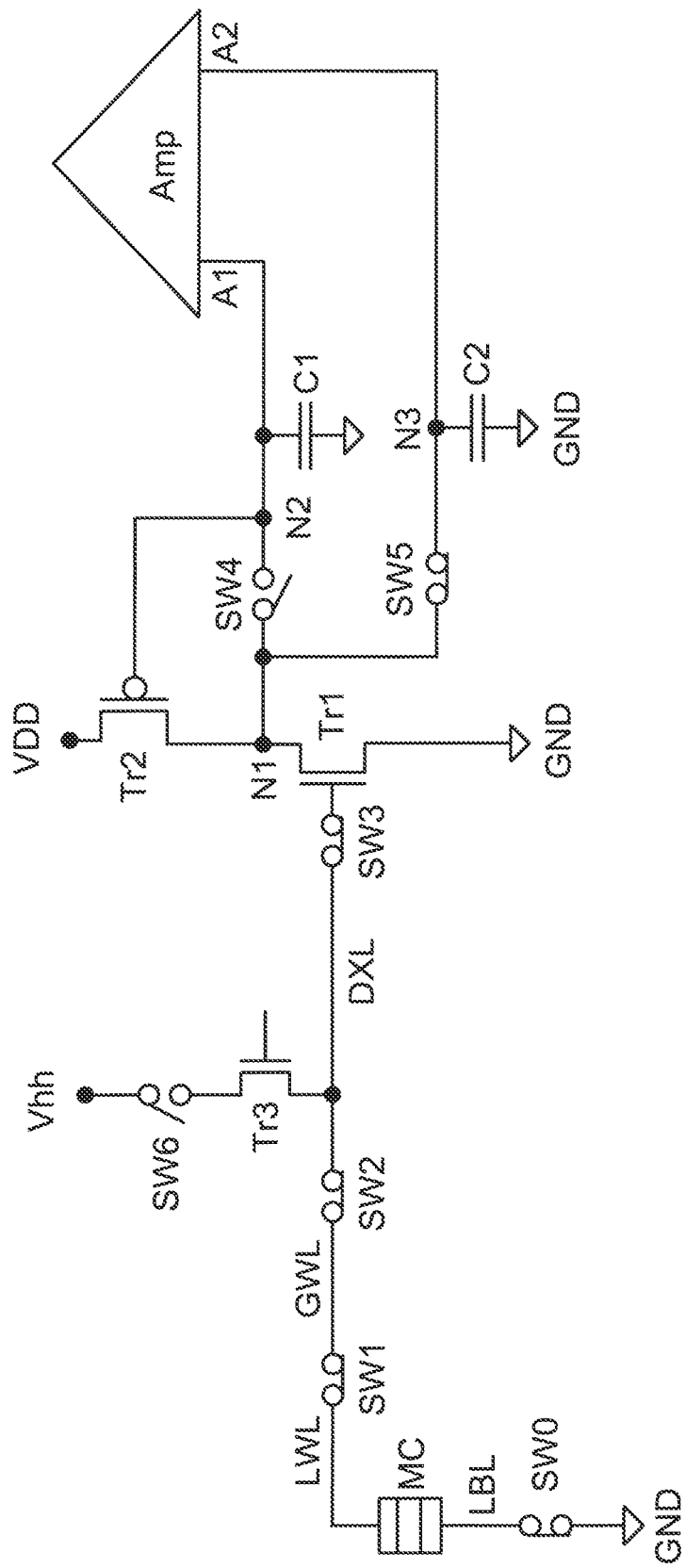
FIG. 9 is a circuit diagram for explaining a principle of the read operation of the memory system according to the embodiment.
Figure 10:
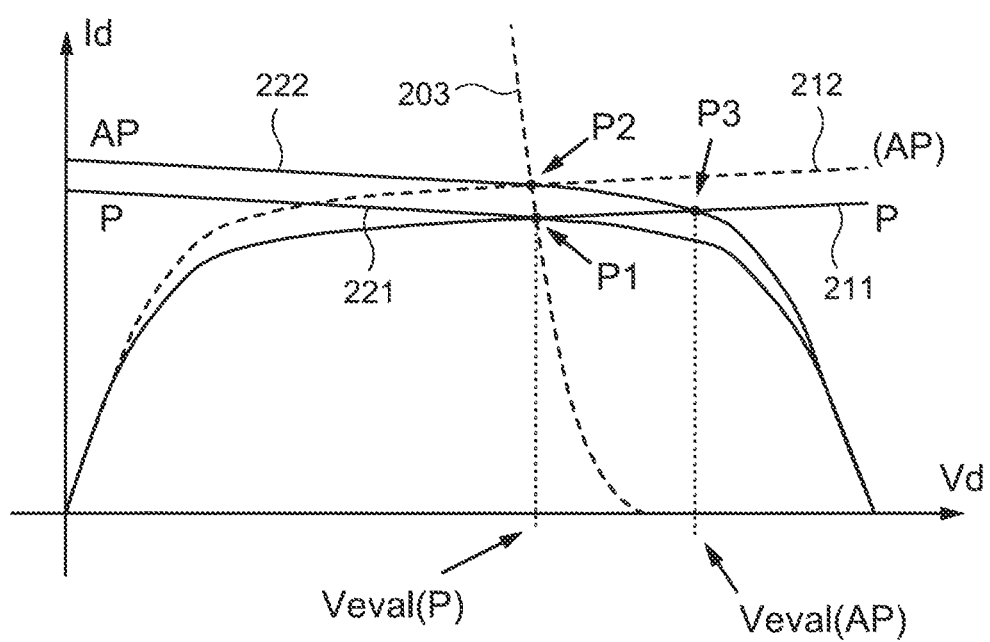
FIG. 10 is a diagram for explaining a principle of the read operation of the memory system according to an embodiment.

A principle of the read operation of the memory system will be described with reference to FIG. 7 to FIG. 11. FIG. 7 and FIG. 8 are diagrams for explaining the first read operation. FIG. 9 and FIG. 10 are diagrams for explaining the second read operation. FIG. 7 and FIG. 9 show circuit diagrams of respective read operations. FIG. 8 and FIG. 10 are diagrams showing voltages supplied to a node N1 (shown in FIG. 7 and FIG. 9) in each of the read operations. The read operation may be referred to as the "sense operation" or the "sense amplifier operation".

In the configurations illustrated in FIG. 7 and FIG. 9, the memory cell MC is provided between the local bit line LBL and the local word line LWL. A ground potential is supplied to the local bit line LBL via a switch element SW0. In the case where the switch element SW0 is in an on-state, the ground potential is supplied to the local bit line LBL. In the case where the switch element SW0 is in an off-state, the local bit line LBL is supplied with a voltage Vusel. For example, the voltage Vusel is a voltage about half of the threshold voltage Vth. A switch element SW1 is provided between the local word line LWL and the global word line GWL. A switch element SW2 is provided between the global word line GWL and a data X direction wiring DXL. A switch element SW3 is provided between the data X direction wiring DXL and a gate terminal of a transistor Tr1. The transistor Tr1 is a NMOS transistor (hereinafter referred to as "NMOS").

A first terminal of the transistor Tr1 is connected to a power line GND to which a ground potential is supplied. A second terminal of the transistor Tr1 is connected to the node N1. A transistor Tr2 is provided between a power line VDD and the node N1. The transistor Tr2 is a PMOS transistor (hereinafter referred to as "PMOS"). A first terminal of the transistor Tr2 is connected to the power line VDD. A second terminal of the transistor Tr2 is connected to the node N1. A gate terminal of the transistor Tr2 is connected to a node N2. A switch element SW4 is provided between the node N1 and the node N2. That is, the gate terminal of the transistor Tr2 is connected to the second terminal of the transistor Tr2 via the switch element SW4.

A sense amplifier Amp includes a terminal A1 and a terminal A2. The node N2 is connected to the terminal A1. A capacitor C1 is connected to the node N2. The capacitor C1 holds a voltage of the node N2. A switch element SW5 is provided between the node N1 and the terminal A2. The capacitor C2 is connected to a node N3 between the switch element SW5 and the terminal A2. The capacitor C2 holds a voltage of the node N3.

A switch element SW6 and a transistor Tr3 are connected in series between the data X direction wiring DXL and a power line Vhh. The power line Vhh may be referred to as a "second power line". The switch element SW6 may be referred to as a "second switch element". The power line Vhh is supplied with a high voltage for precharging the local word line LWL, the global word line GWL, and the data X direction wiring DXL. The voltage supplied to the power line Vhh may be referred to as a "first voltage Vprc". For example, the first voltage Vprc is determined based on the threshold voltage Vth of the switching element 102 of the memory cell MC. Specifically, the first voltage Vprc is [Vth+5σ×Vth] and is about twice the voltage of the voltage Vusel. Of course, the first voltage Vprc is not limited to the above values. The switch element SW1 to the switch element SW6 may be switched between the on-state and the off-state, and NMOS or PMOS are used.

As shown in FIG. 7, in the first read operation, the switch element SW1 to the switch element SW3 are controlled to be in the on-state, and the local word line LWL connected to the memory cell MC to be read is connected to the gate terminal of the transistor Tr1. The switch element SW4 is controlled to be in the on-state, and the gate terminal is connected to the second terminal in the transistor Tr2. That is, when the switch element SW4 is in the on-state, the transistor Tr2 is in a diode-connected state. The transistor Tr1 is supplied with a voltage caused by a resistance state of the memory cell MC. In other words, a current flowing through the transistor Tr1 is determined by the resistance state of the memory cell MC. Consequently, the voltage of the node N1 depends on the resistance state of the memory cell MC. In the capacitor C1, a sample voltage Vsmpl based on the resistance state of the memory cell MC is held.

With reference to FIG. 8, a voltage supplied to the node N1 in the state shown in FIG. 7 will be described. FIG. 8 shows Id-Vd properties of the transistor Tr1 and transistor Tr2. A property 201 is a property of the transistor Tr1 in the case where the memory cell MC (variable resistance element 101) is in the low resistance state "P". A property 202 is a property of the transistor Tr1 in the case where the memory cell MC is in the high resistance state "AP". A property 203 is a property of the diode-connected transistor Tr2 as described above.

In the case where the memory cell MC is in the low resistance state "P", the voltage supplied to the node N1 is determined to be Vsmpl(P) based on an intersection P1 between the property 201 and the property 203. In the case where the memory cell MC is in the high resistance state "AP", the voltage supplied to the node N1 is determined to be Vsmpl(AP) based on an intersection P2 between the property 202 and the property 203. As shown in FIG. 8, in the diode-connected transistor Tr2, the current Id rises steeply with respect to a change in the voltage Vd. Consequently, in the state shown in FIG. 7, even in the case where the resistive states of the memory cells MC differ, the difference (Vsmpl(P)–Vsmpl(AP)) of the node N1 is small.

After the first read operation described above, the write operation to the low resistance state "P" or the high-resistance state "AP" is performed on the memory cell MC to be read. In the case where the write operation is performed, the switch element SW3 is controlled to be in the off-state, the switch element SW1 and the switch element SW2 are controlled to be in the on-state, and the data X direction wiring DXL is supplied with the voltage required for the write operation from the power line Vhh. After the write operation, the following second read operation is performed. In the following description, a case where the write operation to the low resistance state "P" is executed as the above described write operation will be described.

As shown in FIG. 9, in the second read operation, the switch element SW1 to the switch element SW3 is controlled to be in the on-state, and the local word line LWL connected to the memory cell MC to be read is connected to the gate terminal of the transistor Tr1. The switch element SW4 is controlled to be in the off-state, and the diode connection of the second transistor Tr2 is released. Since the capacitor C1 holds the sample voltage Vsmpl, the transistor Tr2 exhibits the Id-Vd property in which the gate terminal thereof is controlled by the sample voltage Vsmpl. The gate terminal of the transistor Tr1 is supplied with a voltage caused by the resistance state of the memory cell MC after the write operation to the low resistance state "P" is executed. The voltage of the node N1 is determined based on the relationship between the transistor Tr1 and the transistor Tr2. Since the switch element SW5 is controlled to be in the on-state, the voltage (an evaluation voltage Veval) of the node N1 is held in the capacitance element C2.

In FIG. 7 and FIG. 9, although the local bit line LBL is supplied with the ground potential GND, the local bit line LBL may be supplied with a voltage of about half the threshold voltage Vth.

With reference to FIG. 10, the voltage supplied to the node N1 in the state shown in FIG. 9 will be described. As in FIG. 8, the Id-Vd property of the transistor Tr1 and transistor Tr2 is shown in FIG. 10. A property 211 is a property of the transistor Tr1 in the case where a voltage is supplied to the gate terminal of the transistor Tr1 via the memory cell MC in which the write operation to the low resistance state "P" is executed. A property 212 indicated by a dotted line for reference is a property of the transistor Tr1 in the case where the write operation to the high resistance state "AP" is performed in the write operation described above. A property 221 is a property of the transistor Tr2 in the case where the sample voltage Vsmpl(P) is held in the capacitor C1 by the first read operation. Thus, the property 221 is a curved line passing through the intersection point P1. A property 222 is a property of the transistor Tr2 in the case where the sample voltage Vsmpl(AP) is held in the capacitor C1 by the first read operation. Thus, the property 222 is a curved line passing through the intersection P2.

As described above, in the case where the memory cell MC is in the low resistance state "P" during the first read operation, the voltage supplied to the node N1 during the second read operation is determined to be a voltage Veval(P) based on the intersection P1 between the property 211 and the property 221. In the case where the memory cell MC is in the low resistance state "AP" during the first read operation, the voltage supplied to the node N1 during the second read operation is determined to be the voltage Veval(AP) based on an intersection P3 between the property 211 and the property 222.

Figure 11:
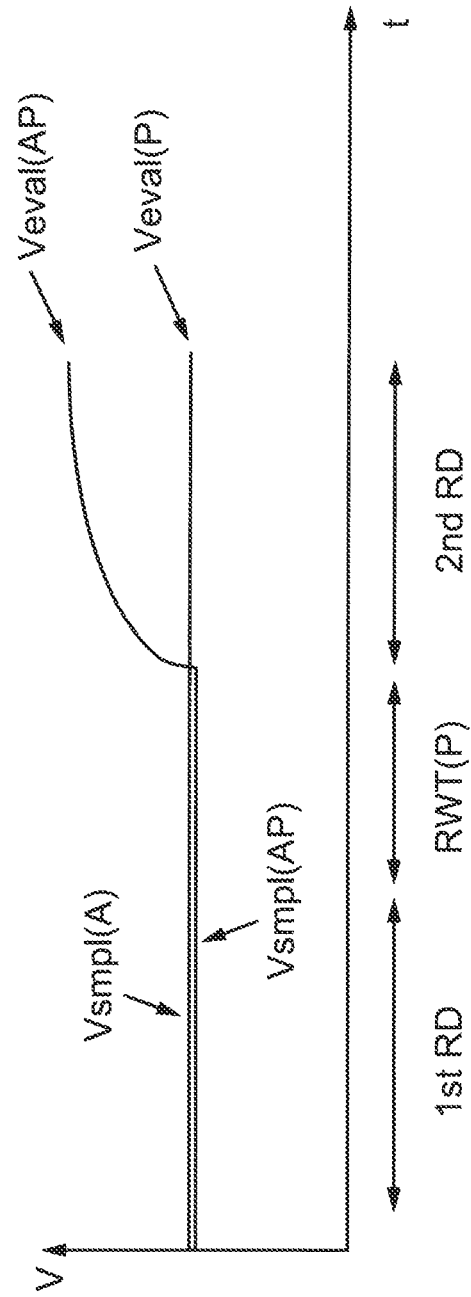
FIG. 11 is a diagram for explaining a principle of the read operation of the memory system according to the embodiment.

FIG. 11 is a diagram illustrating a variation of the node N1 in respective operations. The horizontal axis in FIG. 11 indicates the time. The vertical axis indicates the voltage supplied to the node N1. The horizontal axis of the graph is divided into the first read operation ($1^{st}$ RD), the write operation (RWT (P)) to the low resistance state "P", and the second read operation ($2^{nd}$ RD).

In a period of the first read operation, since the transistor Tr2 is a diode connected as shown in FIG. 7, even if the resistance state of the memory cell MC is the low resistance state "P" or the high resistance state "AP", there is no large difference in the voltage (Vsmpl (P) and Vsmpl (AP)) supplied to the node N1 as shown in FIG. 8. Even during the write operation, the voltage supplied to the node N1 is the same as that described above. During the second read operation, since the transistor Tr2 is a diode disconnected as shown in FIG. 9, the voltage Veval (AP) is higher than the voltage Veval (P) as shown in FIG. 10.

As described above, it is possible to determine the resistance state of the memory cell MC when the first read operation is executed by evaluating the voltage of the node N1 obtained by the second read operation. In other words, the status of the memory cell MC that is the target of the read operation can be determined based on the difference between the first target voltage obtained by the first read operation and the second target voltage obtained by the second read operation. As shown in FIG. 7 and FIG. 9, the first target voltage is supplied to the terminal A1 of the sense amplifier Amp, and the second target voltage is supplied to the terminal A2. The terminal A1 may be referred to as a "first sense terminal". The terminal A2 may be referred to as a "second sense terminal".

[1-8. Circuit Configuration of Read Operation]

Figure 12A:
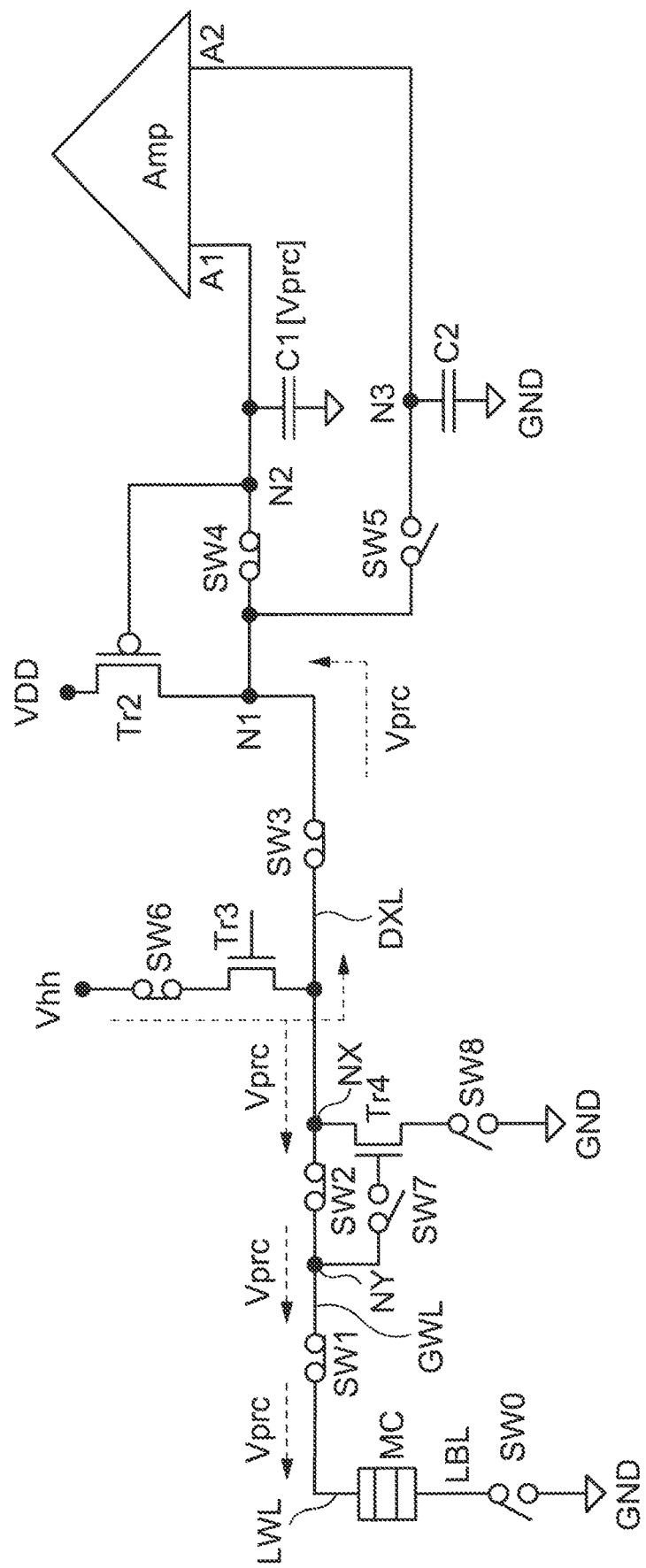
FIG. 12A is a circuit diagram illustrating the read operation of the memory system according to an embodiment.

FIG. 12A is a circuit diagram illustrating the read operation of the memory system according to an embodiment. The circuit diagram shown in FIG. 7 is similar to the circuit diagram shown in FIG. 9, but different from the circuit diagram shown in FIG. 9 in that a transistor Tr4 is provided instead of the transistor Tr1 shown in FIG. 7 and FIG. 9.

The transistor Tr4 may be referred to as a "first transistor". The local word line LWL may be referred to as a "first wiring". The local bit line LBL may be referred to as a "second wiring". The data X direction wiring DXL may be referred to as a "third wiring". The switch element SW2 may be referred to as a "first switch element". In the present embodiment, although a configuration in which the switch element SW2 is provided between the global word line GWL and the data X direction wiring DXL is exemplified, the configuration is not limited to this configuration. For example, the switch element SW2 may be provided between the local word line LWL and the global word line GWL. That is, it can be said that the switch element SW2 (the first switch element) is provided between the local word line LWL (the first wiring) and the data X direction wiring DXL (the third wiring).

As shown in 12A, a first terminal of the transistor Tr4 is connected to the data X direction wiring DXL between the switch element SW2 and the switch element SW3. A second terminal of the transistor Tr4 is connected to the power line GND via a switch element SW8. A gate terminal of the transistor Tr4 is connected to the global word line GWL via a switch element SW7. The transistor Tr4 is NMOS. The transistor Tr4 is used as a transistor for determining the voltage to be supplied to the node N1, similar to the transistor Tr1 of FIG. 7 and FIG. 9. That is, the properties of the transistor Tr4 are the same as the property 201 and the property 202 of FIG. 8 and the property 211 and the property 212 of FIG. 10.

In the present embodiment, although a configuration in which the first terminal of the transistor Tr4 is connected to the data X direction wiring DXL and the gate terminal thereof is connectable to the global word line GWL has been exemplified, the configuration is not limited to this configuration. For example, the first terminal of the transistor Tr4 may be connected to the global word line GWL, and the gate terminal thereof may be connected to the local word line LWL. Alternatively, a configuration may be adopted in which the first terminal of the transistor Tr4 is connected to the data X direction wiring DXL, and the gate terminal thereof is connectable to the local word line LWL. If nodes located on a wiring from the local word line LWL (the first wiring) to the data X direction wiring DXL (the third wiring) are defined as a node NX and a node NY, it can be said that the first terminal of the transistor Tr4 is connected to the node NX and the gate terminal of the transistor Tr4 is connected to the node NY. The switch element SW2 is provided between the node NX and the node NY. The node NX may be referred to as a "first node". The node NY may be referred to as a "second node". The node NX is located closer to the sense amplifier Amp than the switch element SW2 (the first switch element). The node NY is located closer to the memory cell MC than the switch element SW2.

[1-9. Read Operation]

The read operation of the memory system according to the present embodiment will be described with reference to FIG. 12A to FIG. 12D and FIG. 13.

The circuit diagrams shown in FIG. 12A to FIG. 12D are all the same circuit diagrams, but differ in the on/off control status of the switch element SW0 to the switch element SW8. The following operations are performed by the control circuit 40.

Figure 13:
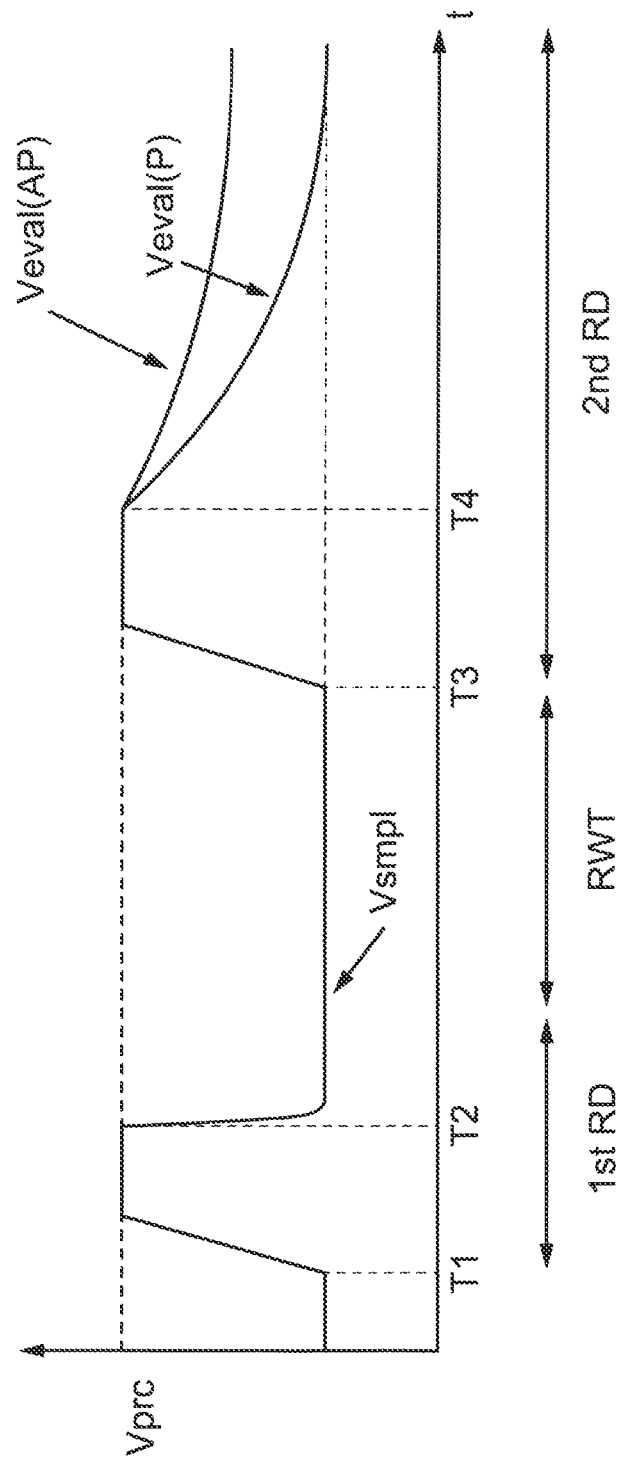
FIG. 13 is a timing chart related to the read operation of the memory system according to an embodiment.

A control state shown in FIG. 12A is a state in a time T1 of FIG. 13. As shown in FIG. 12A, the switch element SW1 to the switch element SW4 and the switch element SW6 are controlled to be in the on-state, and the switch element SW0, the switch element SW5, the switch element SW7 and the switch element SW8 are controlled to be in the off-state. In this state, since the switch element SW2 is in the on-state, the node NX and the node NY are connected to each other. Therefore, the local word line LWL, the global word line GWL, and the data X direction wiring DXL are charged (a precharge operation) based on the first voltage Vprc supplied from the power line Vhh. Due to the precharge operation, the voltage supplied to the node N1 gradually increases from the time T1 and stabilizes at the first voltage Vprc. At this time, the voltage Vusel (the voltage of about half of the threshold voltage Vth) is supplied to the local bit line LBL.

Figure 12B:
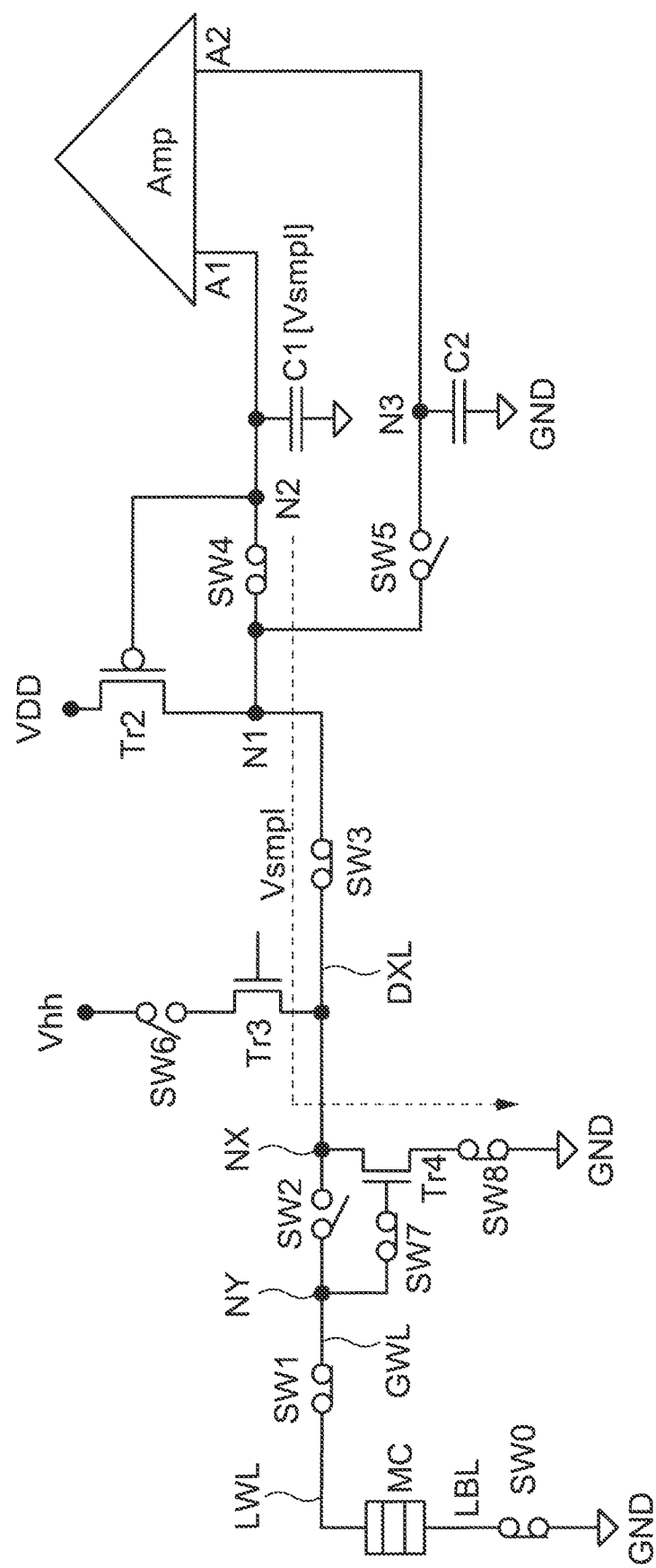
FIG. 12B is a circuit diagram illustrating the read operation of the memory system according to an embodiment.

A control state shown in the diagram FIG. 12B is a state in a time T2 of FIG. 13. As shown in 12B, the switch element SW2 and the switch element SW6 are switched to the off-state and the switch element SW0, the switch element SW7 and switch element SW8 are switched to the on-state.

The gate terminal of the transistor Tr4 and the node NY are connected by controlling the switch element SW2 to be in the off-state and the switch element SW7 to be in the on-state, so that the local word line LWL and the global word line GWL are connected to the gate terminal of the transistor Tr4. Charges move from the local word line LWL to the local bit line LBL due to the resistive state of the memory cell MC by controlling the switch element SW0 to be in the on-state. Then, as shown in FIG. 5, when the voltage between both the terminals of the memory cell MC reaches the hold voltage Vhold, the switching element 102 is switched from the low resistance state to the high resistance state, and the voltage between both the terminals of the memory cell MC is maintained at the hold voltage Vhold. Therefore, the gate terminal of the transistor Tr4 is supplied with a voltage caused by the resistance state of the memory cell MC.

The data X direction wiring DXL and the power line GND are connected through the transistor Tr4 in a state in which the first voltage Vprc is interrupted from being supplied from the power line Vhh by controlling the switch element SW6 to be in the off-state and the switch element SW8 to be in the on-state. Therefore, the charges supplied to the data X direction wiring DXL move to the power line GND through the transistor Tr4 and the switch element SW8. That is, a current flows between the node NX and the power line GND in accordance with the voltage supplied to the gate terminal of the transistor Tr4. Consequently, the voltage supplied to the node N1 gradually decreases from the time T2 and stabilizes at the sample voltage Vsmpl as follows.

The state shown in FIG. 12B is equivalent to the state shown in FIG. 7. The transistor Tr4 of the FIG. 12B has the same function as the transistor Tr1 of FIG. 7. That is, the state shown in FIG. 12B corresponds to the first read operation in FIG. 7. Therefore, the sample voltage Vsmpl is supplied from the node NX to the node N1 in FIG. 12B. Similarly, the sample voltage Vsmpl is also supplied to the gate terminal of the transistor Tr2 and the capacitor C1. In other words, the sample voltage Vsmpl is held in the capacitor C1.

Then, for example, the write operation (RWT) to the low resistance state "P" or the high resistance state "AP" is executed on the memory cell MC to be read by controlling the switch element SW1 and the switch element SW2 to be in the on-state and controlling the switch element SW3 and the switch element SW6 to the switch element SW8 to be in the off-state. The control circuit 40 determines the status of the memory cell MC based on the sample voltage Vsmpl.

Figure 12C:
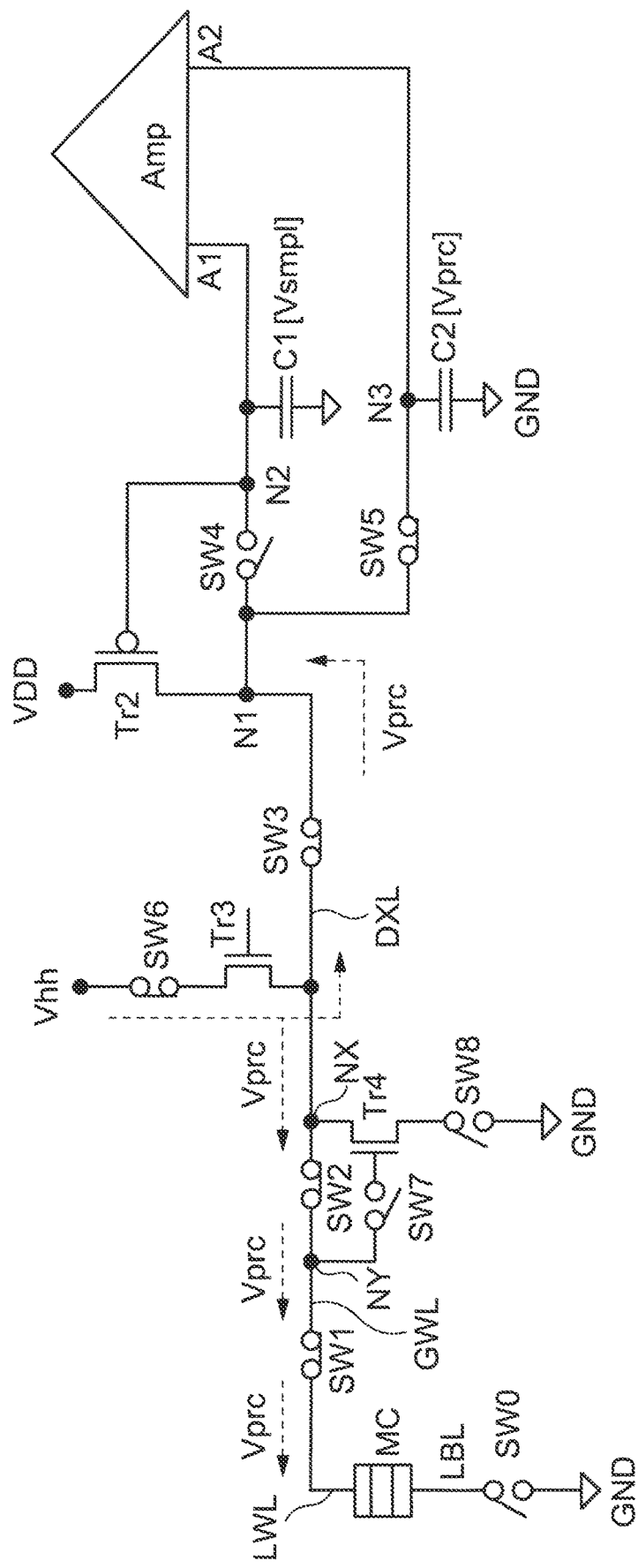
FIG. 12C is a circuit diagram illustrating the read operation of the memory system according to an embodiment.

A control state shown in FIG. 12C is a state in the time T3 of FIG. 13. As shown in FIG. 12C, the switch element SW0, the switch element SW4, the switch element SW7 and the switch element SW8 are controlled to be in the off-state, and the switch element SW1 to the switch element SW3 and the switch element SW5 and the switch element SW6 are controlled to be in the on-state. The state shown in FIG. 12C is similar to the state shown in FIG. 12A, but is different from the state shown in FIG. 12A in that the switch element SW4 is controlled to be in the off-state and the switch element SW5 is controlled to be in the on-state. The local word line LWL, the global word line GWL and the data X direction wiring DXL are charged (the precharge operation) based on the first voltage Vprc supplied from the power line Vhh by being controlled in this manner. Due to the precharge operation, the voltage supplied to the node N1 gradually increases from the time T3 and stabilizes at the first voltage Vprc. At this time, the local bit line LBL is supplied with the voltage Vusel.

Figure 12D:
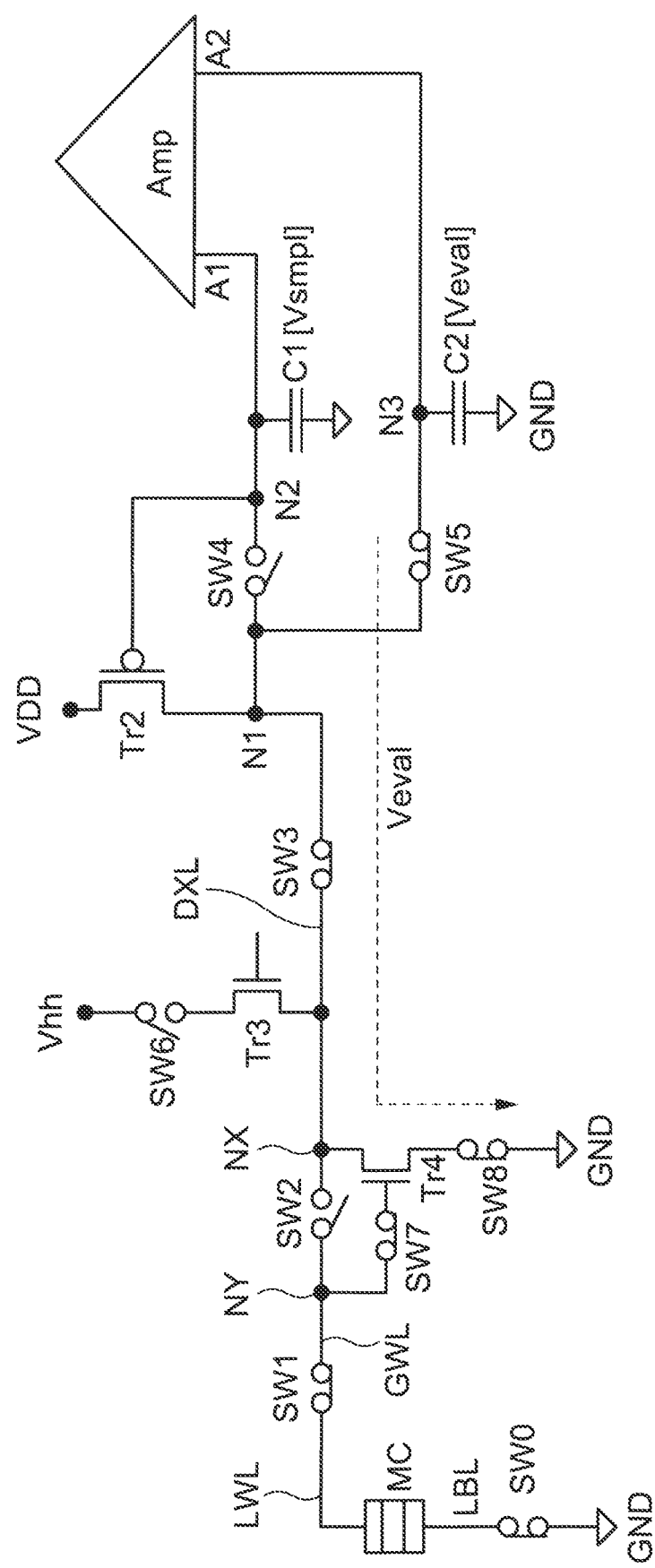
FIG. 12D is a circuit diagram illustrating the read operation of the memory system according to an embodiment.

A control state shown in FIG. 12D is a state in the time T4 of FIG. 13. As shown in FIG. 12D, the switch element SW2 and the switch element SW6 are switched to the off-state and the switch element SW0, the switch element SW7 and the switch element SW8 are switched to the on-state.

The local word line LWL and the global word line GWL are connected to the gate terminal of the transistor Tr4 by controlling the switch element SW2 to be in the off-state and the switch element SW7 to be in the on-state. The voltage between both the terminals of the memory cell MC is maintained by the hold voltage Vhold in the same way as in FIG. 12B by controlling the switch element SW0 being controlled to be in the on-state. Therefore, the gate terminal of the transistor Tr4 is supplied with the voltage caused by the resistance state of the memory cell MC in which the write operation (RWT) is executed.

The first voltage Vprc is interrupted from being supplied from the power line Vhh to the transistor Tr4 by controlling the switch element SW6 to be in the off-state and the switch element SW8 to be in the on-state. In this state, the charges supplied to the data X direction wiring DXL move to the power line GND through the transistor Tr4 and the switch element SW8 because the data X direction wiring DXL and the power line GND are connected. Consequently, the voltage supplied to the node N1 gradually decreases from the time T4 and stabilizes at an evaluation voltage Veval as follows.

The state shown in FIG. 12D is equivalent to the state shown in FIG. 9. The transistor Tr4 of FIG. 12D functions as the transistor Tr1 of FIG. 9. That is, the state shown in FIG. 12D corresponds to the second read operation in FIG. 9. Thus, the node N1 of FIG. 12D is supplied with the evaluation voltage Veval. Similarly, the capacitor C2 holds the evaluation voltage Veval.

As shown in FIG. 10, during the first read operation, the voltage supplied to the node N1 differs between the case where the memory cell MC is in the low resistance state "P" and the case where the memory cell MC is in the low resistance state "AP". Therefore, the behavior of the voltage supplied to the node N1 after the time T4 is Veval (P) in a former case and Veval(AP) in a latter case. As described above, it is possible to determine the resistance state of the memory cell MC when the first read operation is executed by evaluating the voltage of the node N1 obtained by the second read operation.

Comparing the circuit shown in FIG. 12A and the circuit shown in FIG. 7, in the circuit shown in FIG. 7, it is necessary to pass the local word line LWL, the global word line GWL, and the data X direction wiring DXL between the gate terminal of the transistor Tr1 and the memory cell MC, but in the circuit shown in 12A, it is not necessary to pass the data X direction wiring DXL between the gate terminal of the transistor Tr4 and the memory cell MC. Since the data X direction wiring DXL is very long, a parasitic capacitance formed in the data X direction wiring DXL is very large.

In the memory system according to the present embodiment, a voltage equal to or higher than the threshold voltage Vth is applied to the memory cell MC while the local word line LWL is floating. The switching element 102 of the memory cell MC is switched from the high resistance state to the low resistance state by applying this voltage, and charges flow from the local word line LWL to the local bit line LBL via the memory cell MC. Therefore, the potential of the local word line LWL gradually decreases, and the potential between both of the terminals of the memory cell MC decreases. Then, as shown in FIG. 5, when the voltage between both of the terminals of the memory cell MC reaches the hold voltage Vhold, the switching element 102 is switched from the low resistance state to the high resistance state, and the voltage between both of the terminals of the memory cell MC is maintained at the hold voltage Vhold. In this way, the first read operation described above is performed based on the hold voltage Vhold held in the floating state local word line LWL.

For example, in the circuit shown in FIG. 7, the gate terminal of the transistor Tr1 is controlled based on charges held in the local word line LWL in the floating state. Therefore, in the case where the parasitic capacitances of the global word line GWL and the data X direction wiring DXL are large, since the voltage supplied to the gate terminal of the transistor Tr1 varies due to the parasitic capacitances, an operation delay occurs. Furthermore, the circuit size of the global word line GWL is larger than a circuit size of the local word line LWL, and a circuit size of the data X direction wiring DXL is larger than a circuit size of the global word line GWL. Therefore, the parasitic capacitance of the global word line GWL is larger than a parasitic capacitance of the local word line LWL, and the parasitic capacitance of the data X direction wiring DXL is larger than a parasitic capacitance of the global word line GWL.

Therefore, as shown in FIG. 12A, the effect of the parasitic capacitance belonging to the data X direction wiring DXL in the read operation can be suppressed by connecting the gate terminal of the transistor Tr4 to the global word line GWL and interrupting the conduction between the node NX and the node NY by controlling the switch element SW2. As a result, variations in the voltage supplied to the gate terminal of the transistor Tr4 can be reduced as described above, and the operation delay can be suppressed.

2. Second Embodiment

The memory system 1 according to a second embodiment will be described with reference to FIG. 14 and FIG. 15A. The memory system according to the second embodiment is similar to the memory system according to the first embodiment. In the following description, description of the same configuration as that of the memory system according to the first embodiment will be omitted, and differences from the memory system will be mainly described.

[2-1. Circuit Configuration of Read Operation]

Figure 14:
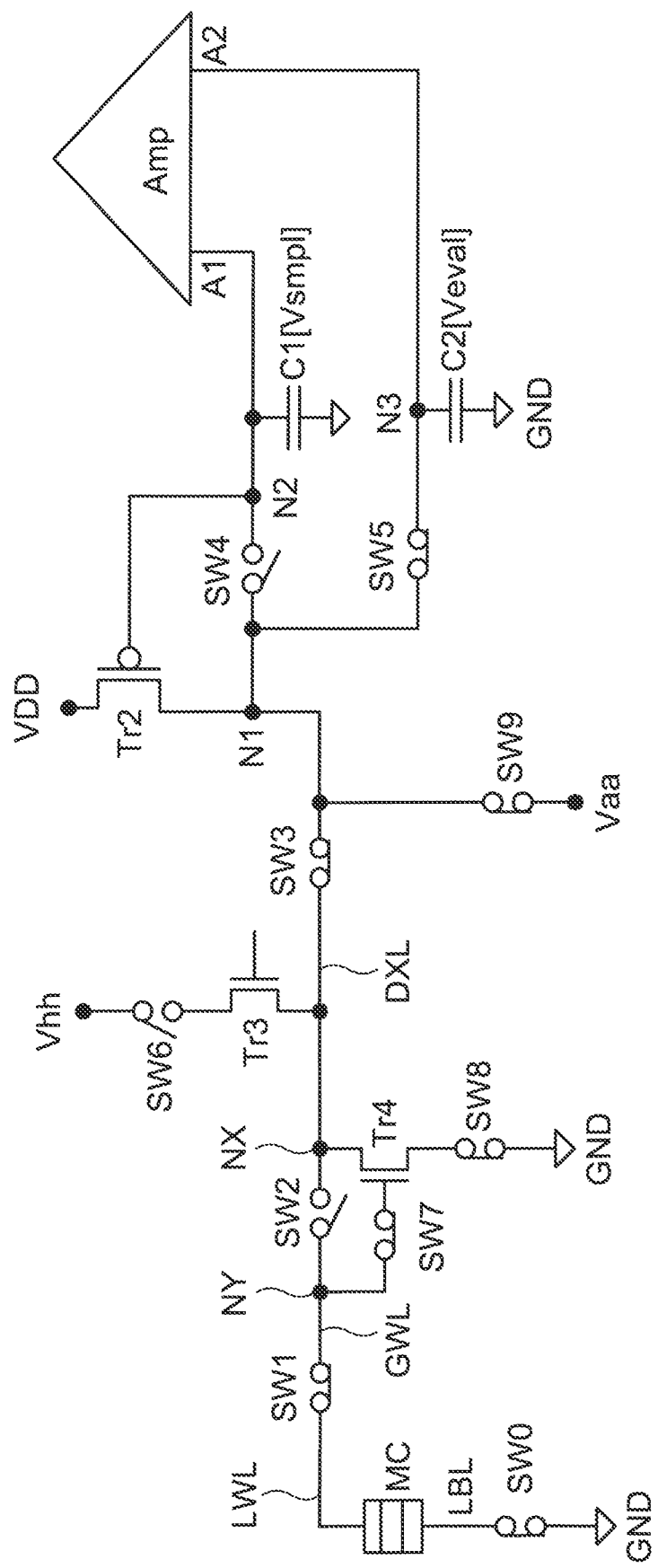
FIG. 14 is a circuit diagram illustrating the read operation of the memory system according to an embodiment.
Figure 15A:
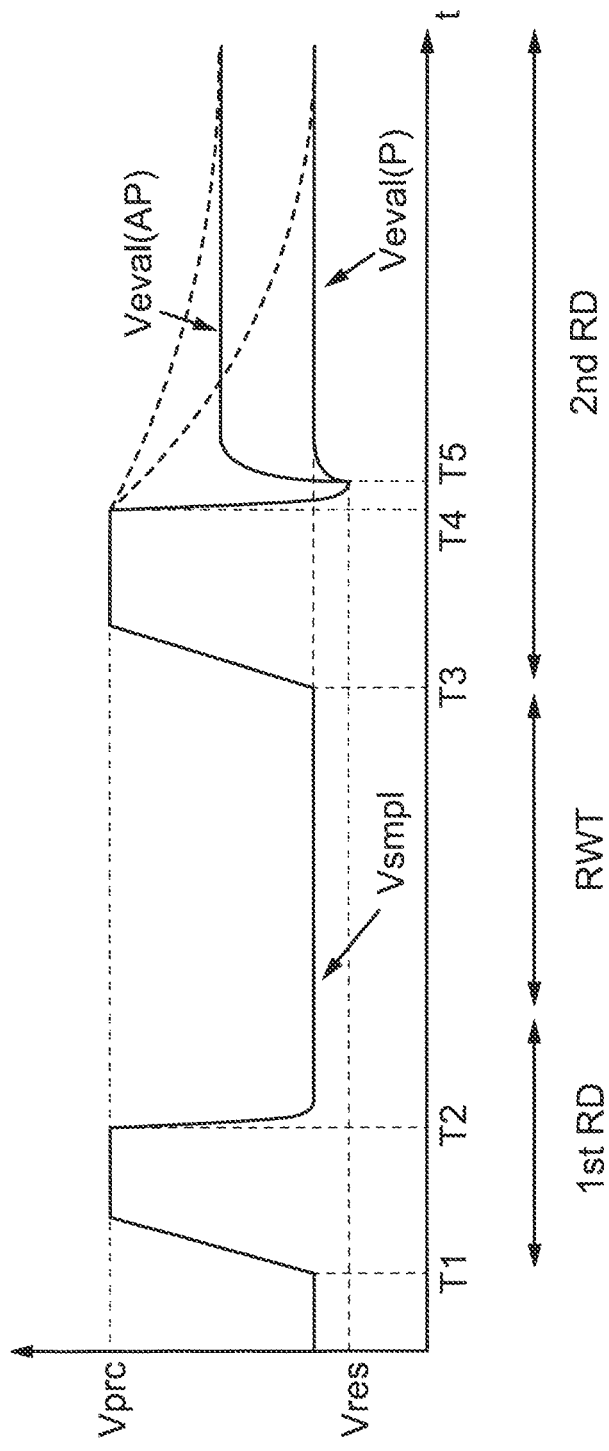
FIG. 15A is a timing chart related to the read operation of the memory system according to an embodiment.

FIG. 14 is a circuit diagram illustrating the read operation of the memory system according to an embodiment. The circuit diagram shown in FIG. 14 is similar to the circuit diagram shown in FIG. 12A, but is different from the circuit diagram shown in FIG. 12A in that a power line Vaa and a switch element SW9 are provided.

As shown in FIG. 14, the power line Vaa is connected to the node N1 via the switch element SW9. A second voltage Vres lower than the first voltage Vprc supplied to the power line Vhh is supplied to the power line Vaa. In FIG. 14, although the power line Vaa is connected between the switch element SW3 and the node N1, the configuration is not limited to this configuration. The power line Vaa may be connected between the switch element SW3 and the node NX. The power line Vaa may be referred to as a "third power line". The switch element SW9 may be referred to as a "third switch element".

[2-2. Read Operation]

The read operation of the memory system according to the present embodiment will be described with reference to FIG. 15A. FIG. 15A is a timing chart relating to the read operation of the memory system according to an embodiment. The timing chart of FIG. 15A is similar to the timing chart of FIG. 13, but the operation after the time T4 is different from the operation in FIG. 13. Since the operation in the time T1 to the time T3 are the same as that in FIG. 13, the explanation will be omitted.

In FIG. 13, the voltage supplied to the node N1 decreases from the state in which the first voltage Vprc is supplied to the node N1 by the precharge operation performed at the time T3 by the current flowing from the node NX to the power line GND via the transistor Tr4. As described above, since the parasitic capacitance of the data X direction wiring DXL is large, the voltage supplied to the node N1 (a dotted line after the time T4 in FIG. 15A) is relatively gradually lowered. On the other hand, in the present embodiment, the switch element SW9 is controlled to be in the off state in the time T1 to the time T3. In the time T4, as shown in FIG. 14, the switch element SW2, the switch element SW4 and the switch element SW6 are controlled to be in the off-state, and the switch element SW9 is controlled to be in the on-state in a state in which the switch element SW0, the switch element SW1, the switch element SW3, the switch element SW5, the switch element SW7 and the switch element SW8 are controlled to be in the on-state. The second voltage Vres is supplied to the node N1 by controlling the switch element SW9 to be in the on-state. Therefore, the voltage supplied to the node N1 at the time T4 (a solid line after the time T4 in FIG. 15A) sharply decreases to the second voltage Vres. Then, the switch element SW9 is controlled to be in the off-state at a time T5. The node N1 is supplied with the estimated voltage Veval depending on the relationship between the sample voltage Vsmpl supplied to the gate terminal of the transistor Tr2 and the voltage supplied to the gate terminal of the transistor Tr4 by being controlled in this way.

Figure 15B:
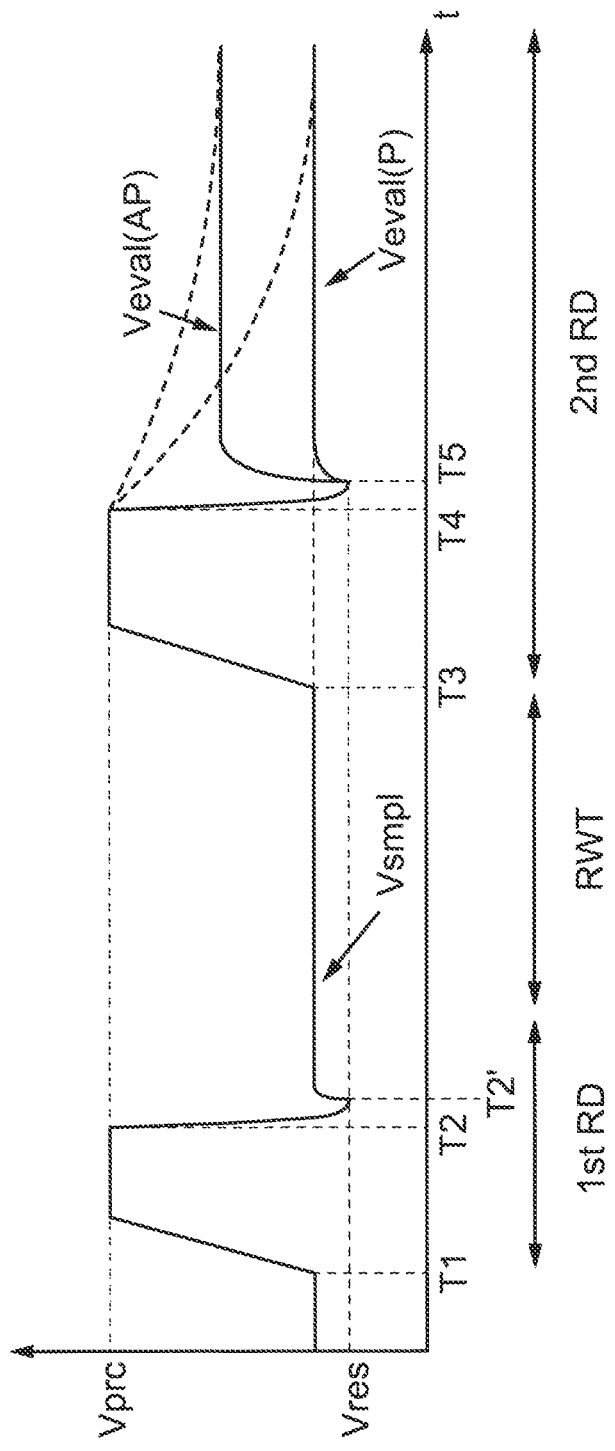
FIG. 15B is a timing chart related to the read operation of the memory system according to an embodiment.

In the read operation described above, a configuration has been exemplified in which the switch SW9 is controlled to be in the on-state only when the time is T4, but the switch SW9 may be controlled to be in the on-state even in the time T2, as shown in FIG. 15B. In this case, the switch SW9 is controlled to the off state at a time T2'.

By the operation described above, it is possible to suppress a delay of the read operation even in the case where the parasitic capacitance of the sense amplifier 60 side is larger than the parasitic capacitance of the node NX. As a result, a faster read operation can be realized.

3. Third Embodiment

The memory system 1 according to a third embodiment will be described with reference to FIG. 16 to FIG. 18E. The memory system according to the third embodiment is similar to the memory system according to the second embodiment. In the following description, descriptions of the same configuration as that of the memory system according to the second embodiment will be omitted, and differences from the memory system will be mainly described.

[3-1. Circuit Configuration of Read Operation]

Figure 16:
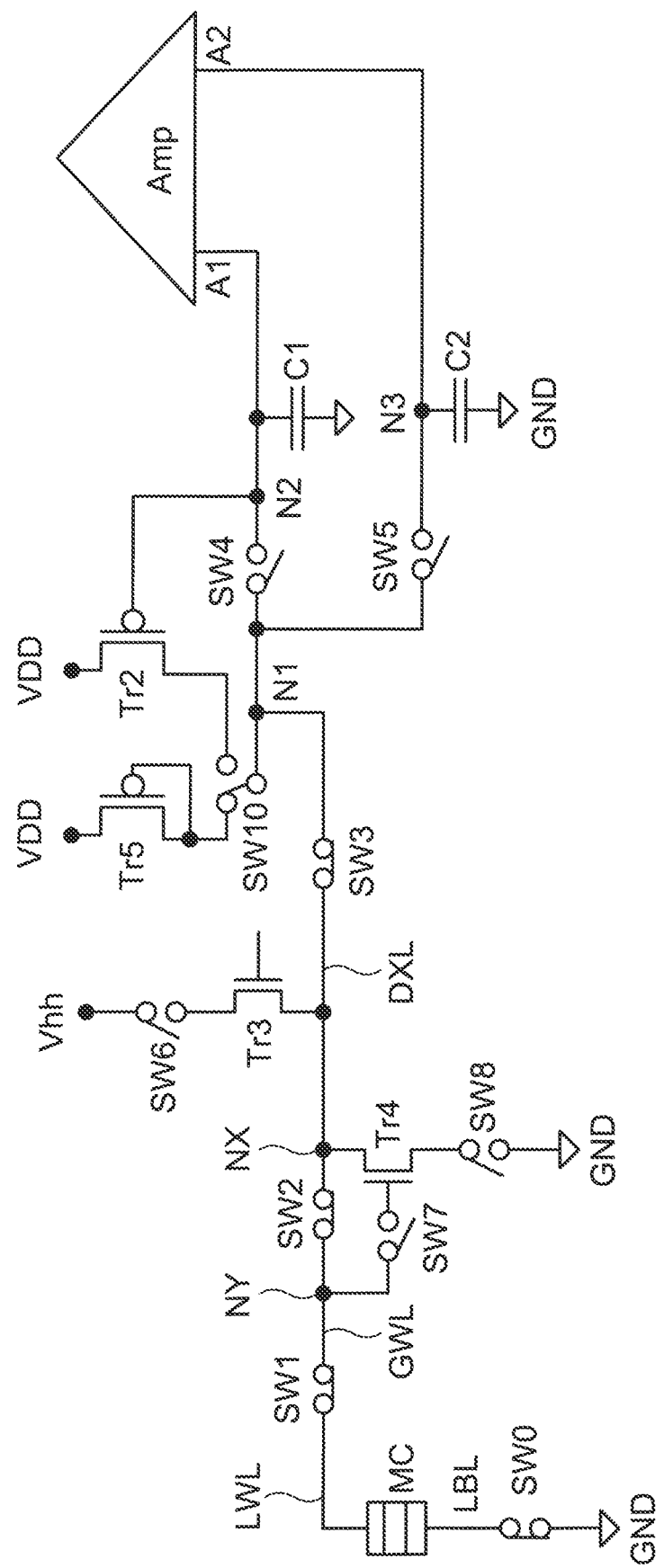
FIG. 16 is a circuit diagram illustrating the read operation of the memory system according to an embodiment.

FIG. 16 is a circuit diagram illustrating the read operation of the memory system according to the embodiment. The circuit diagram shown in FIG. 16 is similar to the circuit diagram shown in FIG. 14. In the circuit diagram of FIG. 14, the node N1 is connected to the power line Vaa via the switch element SW9. On the other hand, in the circuit diagram of FIG. 16, the node N1 is connected to the power line VDD via a switch element SW10 and a transistor Tr5. As described above, the circuit diagram of FIG. 16 is different from the circuit diagram of FIG. 14.

The switch element SW10 is a changeover switch capable of switching the connection between the node N1 and the transistor Tr2 or the connection between the node N1 and the transistor Tr5. The transistor Tr5 is a PMOS. A first terminal of the transistor Tr5 is connected to the power line VDD. A second terminal and a gate terminal of the transistor Tr5 are connected to each other, and they are connected to the switch element SW10. That is, the transistor Tr5 is a diode-connected transistor.

The transistor Tr5 is equivalent to the diode-connected transistor Tr2 in which the switch element SW4 is controlled to be in the on-state as shown in FIG. 7. Therefore, the sample voltage Vsmpl lower than the first voltage Vprc supplied to the power line Vhh is supplied to the node N1 by controlling the switch element SW10 so as to connect the node N1 and the transistor Tr5, the switch element SW1 to the switch element SW3 to be in the on-state, and the switch element SW6 to the switch element SW8 to be in the off-state. In this case, the sample voltage Vsmpl may be referred to as a "second voltage". A circuit constituted by the switch element SW10 and the transistor Tr5 may be referred to as a "reset circuit". It can be said that the reset circuit can be connected to the data X direction wiring DXL via the switch element SW10 and supplies a second voltage (Vsmpl) to the data X direction wiring DXL. The reset circuit is provided with a rectifying action for flowing a current toward the data X direction wiring DXL.

In the above case, the transistor Tr2 may be referred to as a "second transistor". A part or a function of the switch element SW10 for controlling whether or not the node N1 is connected to the transistor Tr2 may be referred to as a "fourth switch element". The switch element SW4 may be referred to as a "fifth switch element". In this case, the gate terminal of the transistor Tr2 (the second transistor) is connected to the terminal A1 of a sense amplifier Amp (the first sense terminal), and the switch element SW10 (the fourth switch element) is provided between one of the source terminal and the drain terminal of the transistor Tr2 and the data X direction wiring DXL (a third wiring). The switch element SW4 (the fifth switch element) is provided between the gate terminal of the transistor Tr2 and the switch element SW10.

[3-2. Read Operation]

Figure 17:
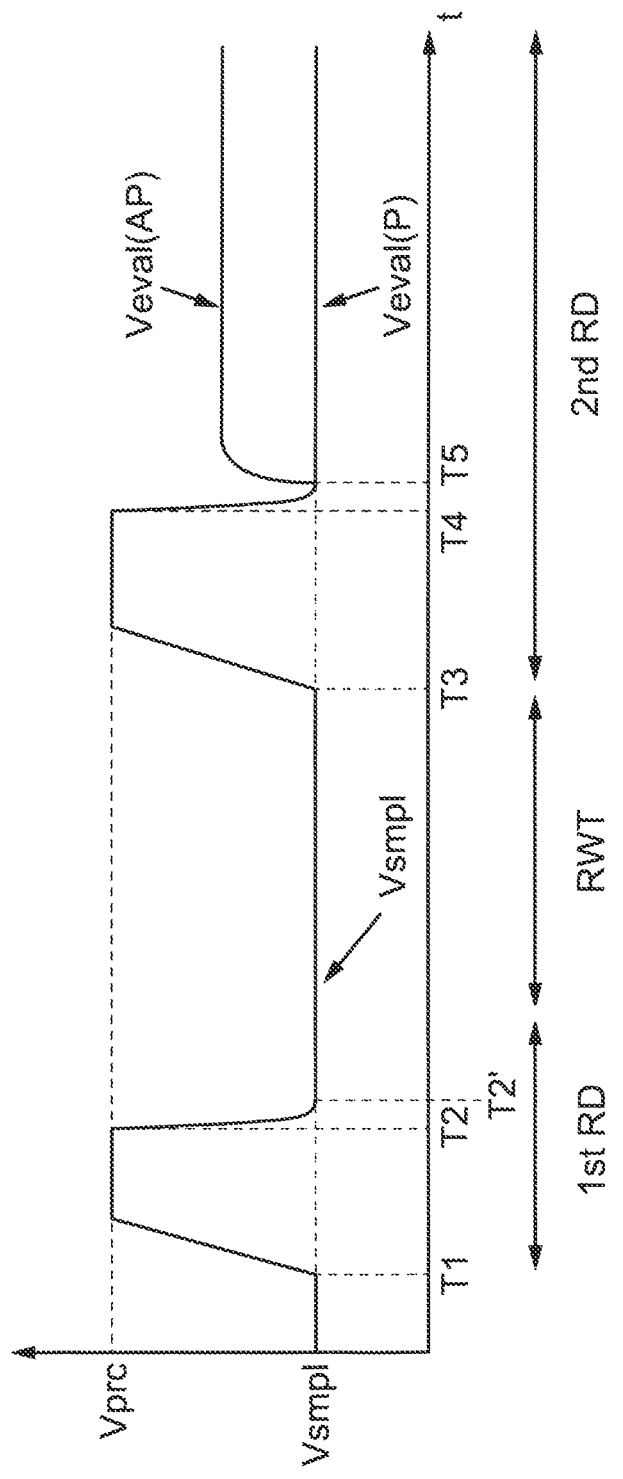
FIG. 17 is a timing chart related to the read operation of the memory system according to an embodiment.

The read operation according to the third embodiment is similar to the read operation according to the second embodiment, but differs from the read operation according to the second embodiment at the time T5 in terms of the voltage supplied to the node N1. Specifically, in the second embodiment, as shown in the FIG. 15A, the voltage supplied to the node N1 at the time T5 is the second voltage Vres. On the other hand, in the third embodiment, as shown in FIG. 17, the voltage supplied to the node N1 at the time of time T5 is the sample voltage Vsmpl. An operation of the third embodiment will be described referring to FIG. 17 and FIG. 18A to FIG. 18E.

Figure 18A:
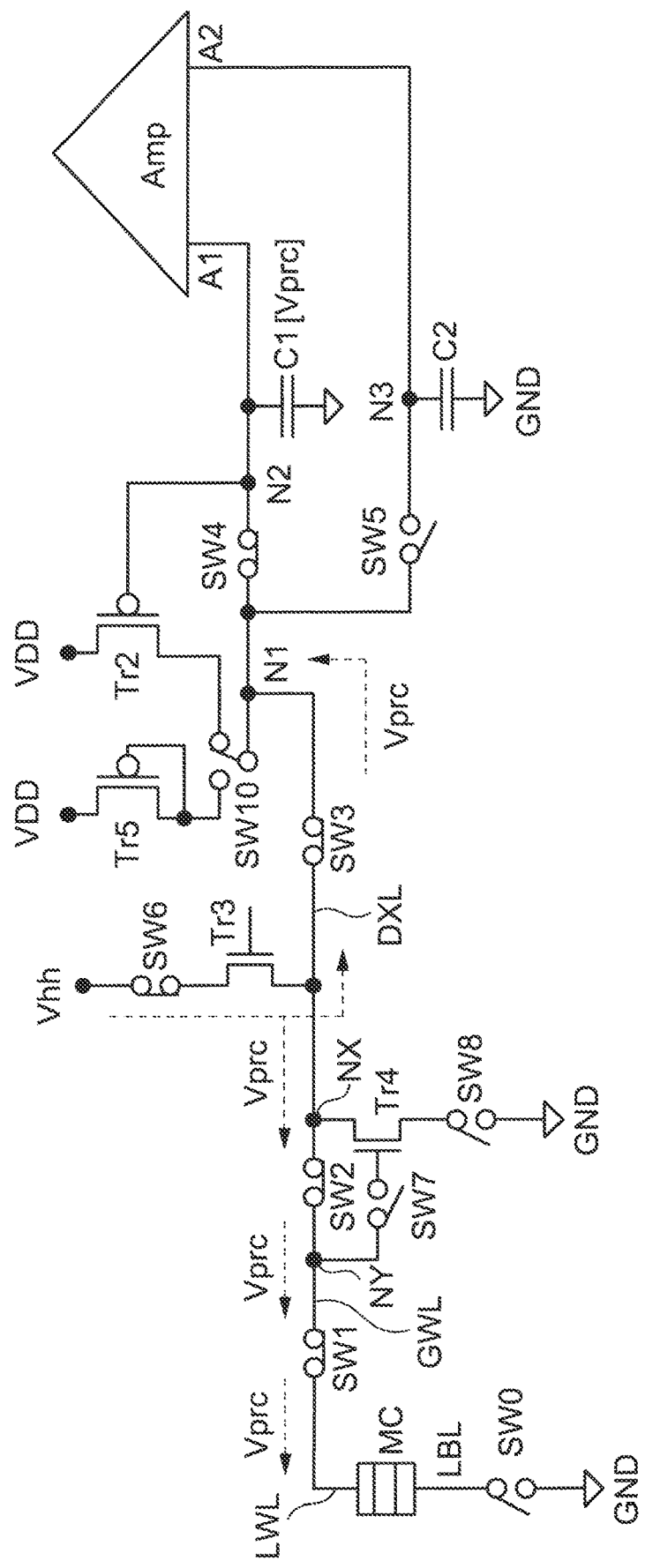
FIG. 18A is a circuit diagram illustrating the memory system according to an embodiment.

A control state shown in FIG. 18A is a state in the time T1 shown in FIG. 17. As shown in FIG. 18A, the switch element SW1 to the switch element SW4 and the switch element SW6 are controlled to be in the on-state, and the switch element SW0, the switch element SW5, the switch element SW7 and the switch element SW8 are controlled to be in the off-state. The switch element SW10 connects the node N1 and the transistor Tr2. In this state, since the switch element SW2 is in the on-state, the node NX and the node NY are connected to each other. Therefore, the local word line LWL, the global word line GWL, and the data X direction wiring DXL are charged (the precharge operation) based on the first voltage Vprc supplied from the power line Vhh. Due to the precharge operation, the voltage supplied to the node N1 gradually increases from the time T1 and stabilizes at the first voltage Vprc. At this time, the local bit line LBL is supplied with the voltage Vusel.

Figure 18B:
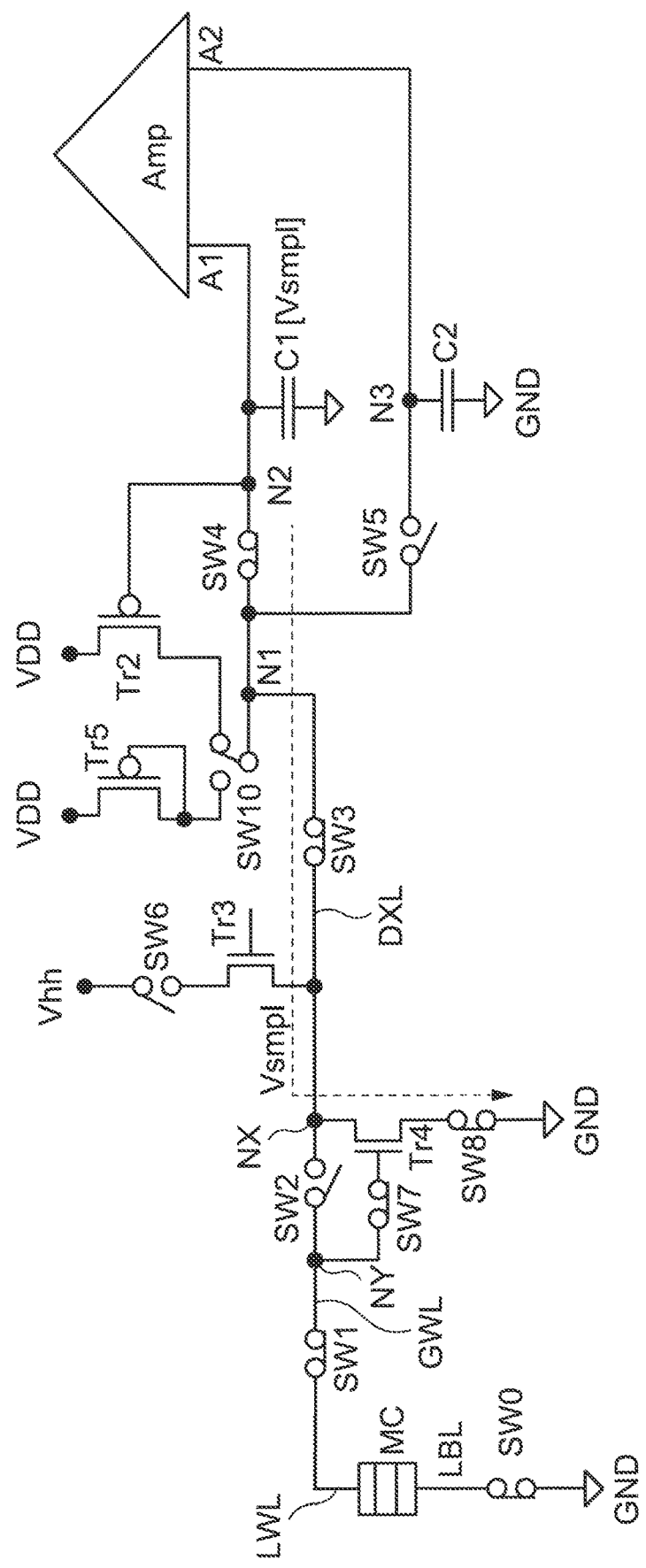
FIG. 18B is a circuit diagram illustrating the memory system according to an embodiment.

A control state shown in FIG. 18B is a state in the time T2 shown in FIG. 17. As shown in 18B, the switch element SW2 and the switch element SW6 are switched to the off-state and the switch element SW0, the switch element SW7 and the switch element SW8 are switched to the on-state. The switch element SW10 is maintained in the state where the node N1 and the transistor Tr2 are connected to each other.

The gate terminal of the transistor Tr4 is connected to the node NY by controlling the switch element SW2 to be in the off-state and the switch element SW7 to be in the on-state. Therefore, the local word line LWL and the global word line GWL are connected to the gate terminal of the transistor Tr4. The voltage between both the terminals of the memory cell MC is maintained at the hold voltage Vhold as in the operation shown in FIG. 12B by controlling the switch element SW0 to be in the on-state. Therefore, the gate terminal of the transistor Tr4 is supplied with the voltage caused by the resistance state of the memory cell MC.

The data X direction wiring DXL and the power line GND are connected through the transistor Tr4 in a state in which the first voltage Vprc is interrupted from being supplied from the power line Vhh by controlling the switch element SW6 to be in the off-state and the switch element SW8 to be in the on-state. Therefore, the charges supplied to the data X direction wiring DXL move to the power line GND through the transistor Tr4 and the switch element SW8. That is, a current flows between the node NX and the power line GND in accordance with the voltage supplied to the gate terminal of the transistor Tr4. Consequently, the voltage supplied to the node N1 gradually decreases from the time T2 and stabilizes at the sample voltage Vsmpl.

The state shown in FIG. 18B is equivalent to the state shown in FIG. 7. The transistor Tr4 of FIG. 18B has the same function as the transistor Tr1 of FIG. 7. That is, the state shown in FIG. 18B corresponds to the first read operation shown in FIG. 7. Therefore, the sample voltage Vsmpl is supplied from the node NX to the node N1 in FIG. 18B. Similarly, the sample voltage Vsmpl is also supplied to the gate terminal of the transistor Tr2 and the capacitor C1. In other words, the sample voltage Vsmpl is held in the capacitor C1.

In other words, the switch element SW2 (the first switch element) and the switch element SW6 (the second switch element) are controlled to be in the off-state, and the switch element SW10 (the fourth switch element) and the switch element SW4 (the fifth switch element) are controlled to be in the on-state, whereby the first target voltage is supplied to the gate terminal of the transistor Tr2 (the second transistor) and the terminal A1 (the first sense terminal) of the sense amplifier Amp.

Then, for example, the write operation (RWT) to the low resistance state "P" or the high resistance state "AP" is executed on the memory cell MC to be read by controlling the switch element SW1 and the switch element SW2 to be in the on-state and controlling the switch element SW3 and the switch element SW6 to the switch element SW8 to be in the off-state. The control circuit 40 determines the status of the memory cell MC based on the sample voltage Vsmpl.

Figure 18C:
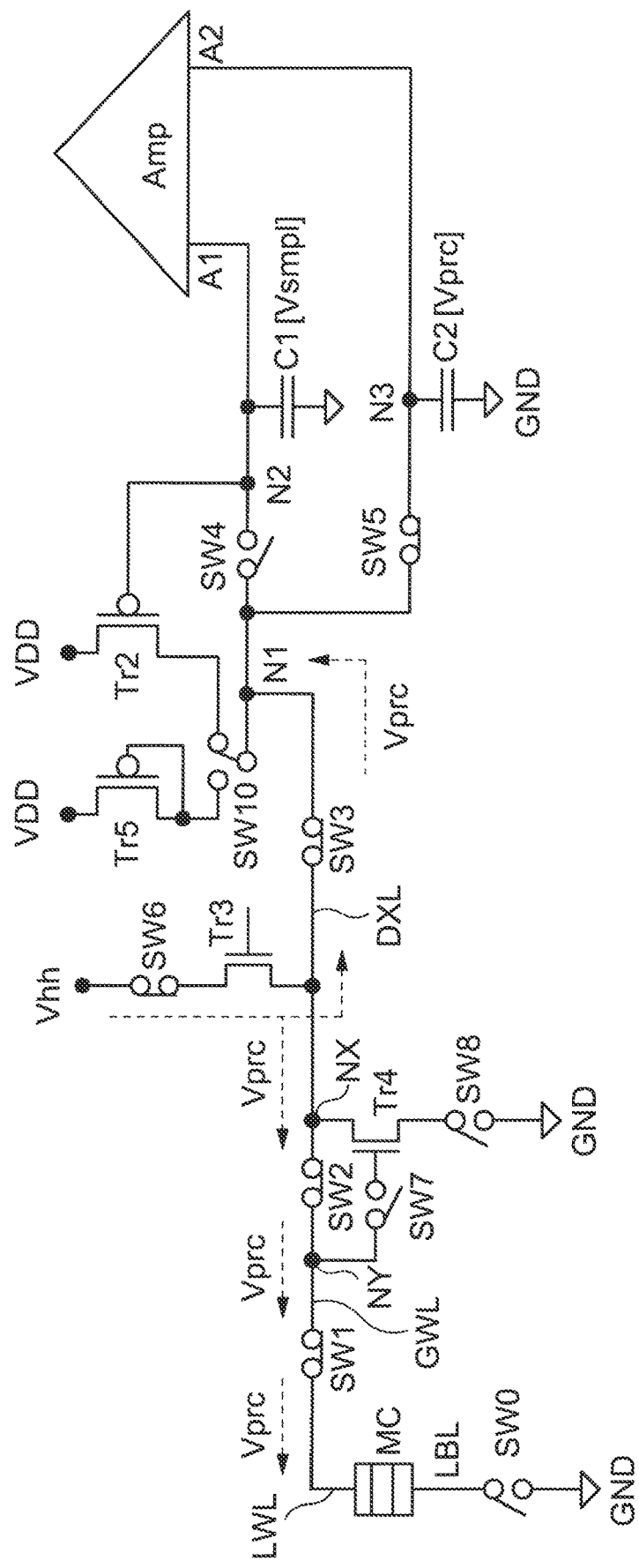
FIG. 18C is a circuit diagram illustrating the memory system according to an embodiment.

A control state shown in the FIG. 18C is a state in the time T3 shown in FIG. 17. As shown in FIG. 18C, the switch element SW0, the switch element SW4, the switch element SW7 and the switch element SW8 are controlled to be in the off-state, and the switch element SW1 to the switch element SW3, the switch element SW5 and the switch element SW6 are controlled to be in the on-state. The switch element SW10 is maintained in the state where the node N1 and the transistor Tr2 are connected to each other. The state shown in the FIG. 18C is similar to the state shown in FIG. 18A, but is different from the state shown in FIG. 18A in that the switch element SW4 is controlled to be in the off-state and the switch element SW5 is controlled to be in the on-state. The local word line LWL, the global word line GWL and the data X direction wiring DXL are charged (the precharge operation) based on the first voltage Vprc supplied from the power line Vhh by being controlled in this manner. Due to the precharge operation, the voltage supplied to the node N1 gradually increases from the time T3 and stabilizes at the first voltage Vprc. At this time, the local bit line LBL is supplied with the voltage Vusel.

Figure 18D:
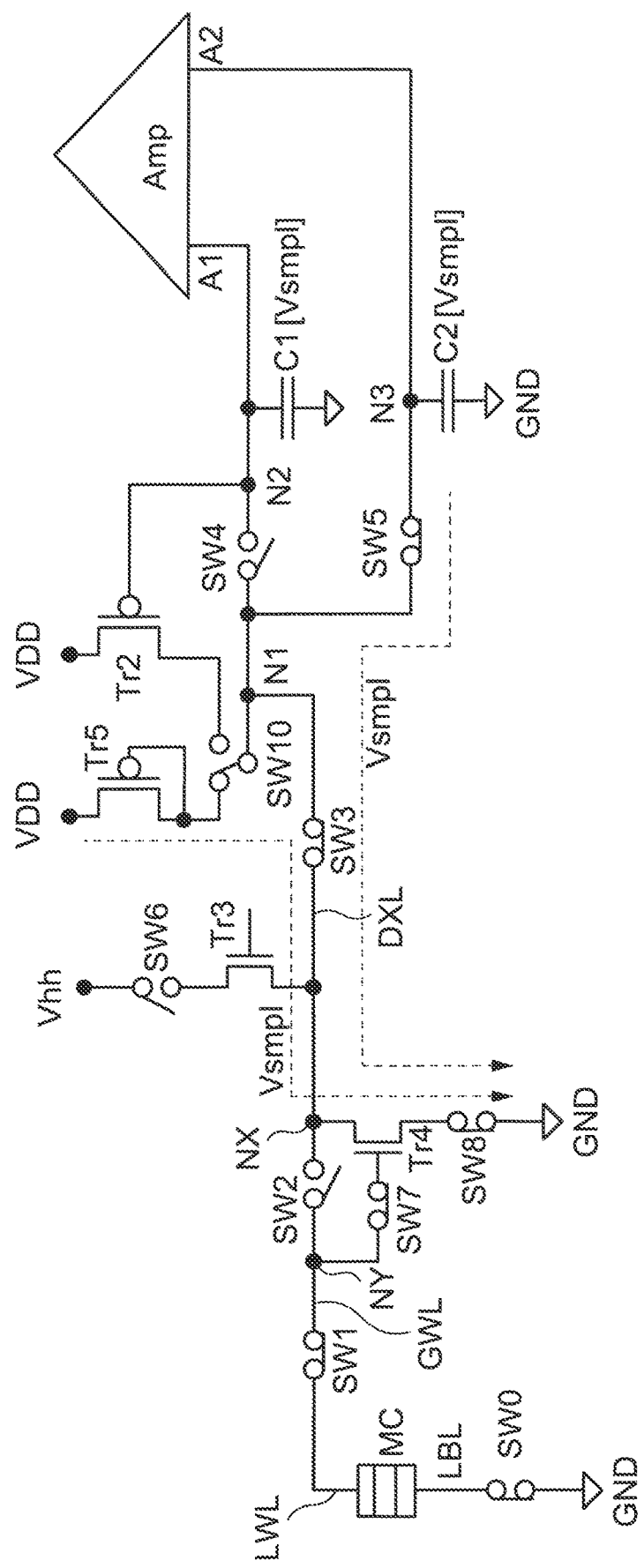
FIG. 18D is a circuit diagram illustrating the memory system according to an embodiment.

A control state shown in FIG. 18D is a state in the time T4 shown in FIG. 17. As shown in FIG. 18D, the switch element SW2 and the switch element SW6 are switched to the off-state and the switch element SW0, the switch element SW7 and the switch element SW8 are switched to the on-state. The switch element SW10 is switched between the node N1 and the transistor Tr5.

The local word line LWL and the global word line GWL are connected to the gate terminal of the transistor Tr4 by controlling the switch element SW2 to be in the off-state and the switch element SW7 to be in the on-state. The voltage between both the terminals of the memory cell MC is maintained by the hold voltage Vhold in the same way as in FIG. 18B by controlling the switch element SW0 being controlled to be in the on-state. Therefore, the gate terminal of the transistor Tr4 is supplied with the voltage caused by the resistance state of the memory cell MC in which the write operation (RWT) is executed.

The first voltage Vprc from the power line Vhh is cut off by controlling the switch element SW6 to be in the off-state, the switch element SW8 to be in the on-state, and the switch element SW10 to be in the state in which the node N1 and the transistor Tr5 are connected to each other. In this state, the data X direction wiring DXL and the power line GND are electrically connected via the transistor Tr4. Therefore, the charges supplied to the data X direction wiring DXL move to the power line GND through the transistor Tr4 and the switch element SW8.

Further, since the switch element SW10 connects the node N1 and the diode-connected transistor Tr5, the node N1 is supplied with the sample voltage Vsmpl in the same manner as FIG. 18B. Therefore, the voltage supplied to the node N1 at the time T4 sharply decreases to the sample voltage Vsmpl. This sample voltage Vsmpl is provided for the same purpose as the second voltage Vres of FIG. 15A. Therefore, in FIG. 18D, the sample voltage Vsmpl supplied to the node N1 via the transistor Tr5 may be referred to as a "second voltage".

In other words, the switch element SW2 (the first switch element), the switch element SW6 (the second switch element), and the switch element SW4 (the fifth switch element) are controlled to be in the off-state, and the connected state between the node N1 and the transistor Tr2 by the switch element SW10 (the fourth switch element) is controlled to be in the off-state, whereby the sample voltage Vsmpl (second voltage) is supplied from the diode-connected transistor Tr5 and the switch element SW10 (reset circuit) to the data X direction wiring DXL (the third wiring).

Figure 18E:
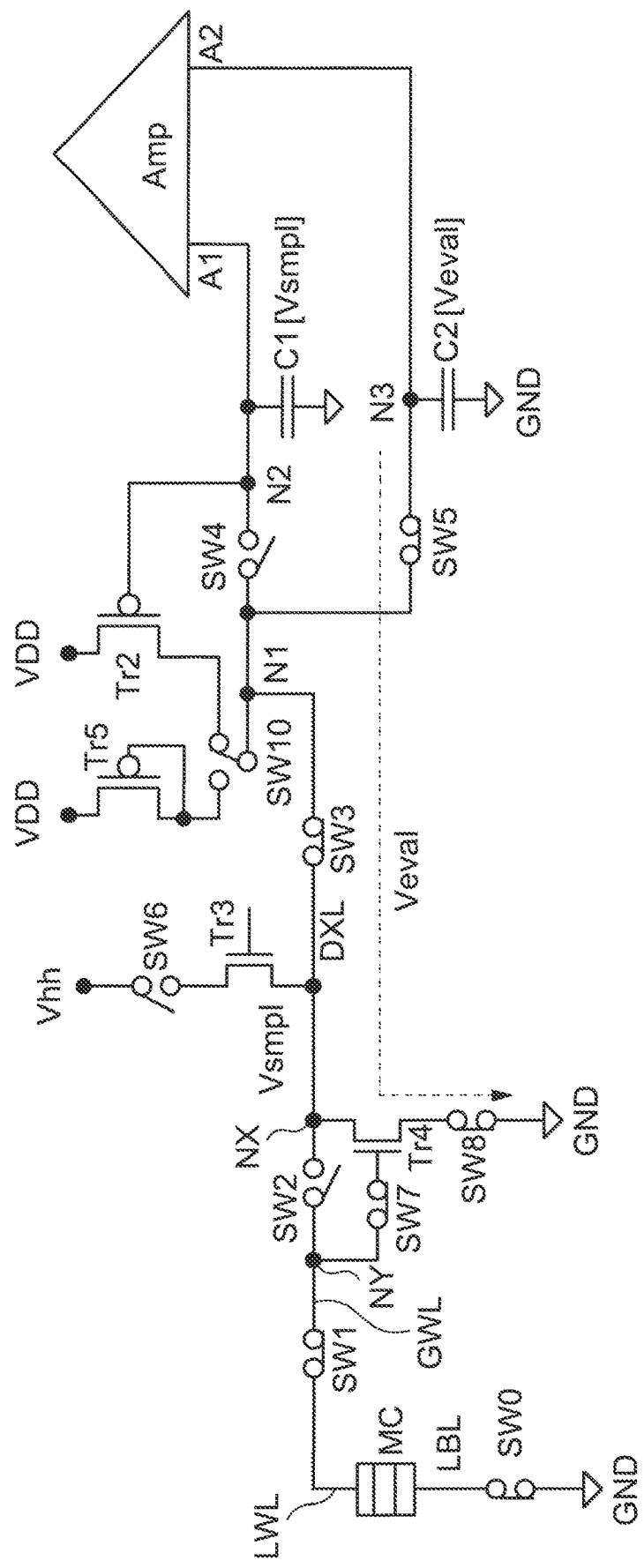
FIG. 18E is a circuit diagram illustrating the memory system according to an embodiment.

A control state shown in FIG. 18E is a state in the time T5 shown in FIG. 17. As shown in FIG. 18E, the switch element SW10 is switched between the node N1 and the transistor Tr2. By being controlled in this way, the node N1 is supplied with an estimated voltage Veval depending on the relationship between the sampled voltage Vsmpl supplied to the gate terminal of the transistor Tr2 and the voltage supplied to the gate terminal of the transistor Tr4.

In other words, the switch element SW2 (the first switch element), the switch element SW6 (the second switch element), and the switch element SW4 (the fifth switch element) are controlled to be in the off-state, and the node N1 and the transistor Tr2 are controlled to be in the on-state by the switch element SW10 (the fourth switch element), whereby the second target voltage is supplied to the terminal A2 (the second sense terminal) of the sense amplifier Amp.

In the read operation described above, the node N1 and the transistor Tr5 are switched to the connected state only when the switch element SW10 is at the time T4, but the switch SW10 may be switched to the connected state of the node N1 and the transistor Tr5 even at the time T2. In this case, the switch SW10 is switched to a state in which the node N1 and the transistor Tr2 are connected after a predetermined time has elapsed from the time T2.

It is possible to suppress the delay of the read operation even in the case where the parasitic capacitance on the sense amplifier 60 side is larger than the node NX by the operation described above. As a result, a faster read operation can be realized.

Although the present invention has been described with reference to the drawings, the present invention is not limited to the embodiments described above, and can be appropriately modified without departing from the spirit of the present invention. For example, based on the memory system of the present embodiment, additions, deletions, or design changes made by a person skilled in the art are also included in the scope of the present invention as long as the present invention is provided. Furthermore, the embodiments described above can be appropriately combined as long as there are no mutual contradictions, and technical matters common to each embodiment are included in each embodiment without explicit description.

It is to be understood that the present invention provides other operational effects that are different from operational effects provided by aspects of the embodiments described above, and those that are obvious from descriptions of the present specification or those that can be easily predicted by a person skilled in the art.

What is claimed is:

1. A memory system comprising:
   a plurality of first wirings extending in a first direction;
   a plurality of second wirings extending in a second direction intersecting the first direction;
   a memory cell connected to the first wiring and the second wiring between the first wiring and the second wiring at a position where the first wiring and the second wiring intersect as viewed from a third direction perpendicular with respect to a plane including the first direction and the second direction;
   a third wiring connectable to each of the plurality of first wirings;
   a sense amplifier connected to the third wiring, the sense amplifier being configured to execute a read operation to the memory cell;
   a first switching element between the plurality of first wirings and the third wiring;
   a first transistor including a first terminal, a second terminal, and a gate terminal, the first terminal being connected to a first node on a wiring connecting the first wiring and the third wiring, the second terminal being connected to a first power source line, and the gate terminal being connected to a second node on a wiring connecting the first wiring and the third wiring; and
   a control circuit,
   wherein:
   the first node is positioned further to the side of the sense amplifier than the first switching element,
   the second node is positioned further to the side of the memory cell than the first switching element, and
   the control circuit is configured to:
   connect the first node and the second node when the first switching element is in an ON state, and
   connect the second node and the gate terminal of the first transistor when the first switching element is in an OFF state.

2. The memory system according to claim 1, wherein a current flows between the first node and the first power source line in accordance with a voltage supplied to the gate terminal of the first transistor.

3. The memory system according to claim 1, wherein the control circuit is configured to:
   connect the gate terminal of the first transistor and the first wiring connected to the memory cell, the memory cell being a target of the read operation, when the read operation is executed, and
   discriminate a state of the memory cell based on a voltage of the first node when the first switching element is in an OFF state.

4. The memory system according to claim 3, wherein the control circuit is configured to:
   supply the first wiring and the third wiring with a first voltage by controlling the first switching element to an ON state,
   switch the first switching element to an OFF state, and
   supply the third wiring with a second voltage lower than the first voltage.

5. The memory system according to claim 4, further comprising:
   a second power source line supplying the first voltage, and
   a second switching element between the second power source line and the third wiring.

6. The memory system according to claim 5, further comprising:
   a third power source line supplying the second voltage, and
   a third switching element between the third power source line and the third wiring.

7. The memory system according to claim 5, further comprising a reset circuit connectable to the third wiring, the reset circuit being configured to supply the third wiring with the second voltage.

8. The memory system according to claim 7, wherein the reset circuit includes a diode element or a diode-connected transistor, and has a rectifying function conducting a current toward the third wiring.

9. The memory system according to claim 8, wherein:
the sense amplifier has a first sense terminal supplied with a first target voltage and a second sense terminal supplied with a second target voltage, and
the control circuit is configured to discriminate a state of the memory cell, the memory cell being a target of the read operation, based on a difference between the first target voltage and the second target voltage.

10. The memory system according to claim 9, further comprising:
a second transistor including a gate terminal connected to the first sense terminal, a source terminal, and a drain terminal, one of the source terminal and the drain terminal of the second transistor being connectable to the third wiring;
a fourth switching element between the third wiring and one of the source terminal and the drain terminal of the second transistor; and
a fifth switching element between the gate terminal of the second transistor and the fourth switching element,
wherein the control circuit is configured to:
supply the first sense terminal and the gate terminal of the second transistor with the first target voltage by controlling the first switching element and the second switching element to an OFF state, and controlling the fourth switching element and the fifth switching element to an ON state,
supply the third wiring with the second voltage from the reset circuit by controlling the first switching element, the second switching element, the fourth switching element, and the fifth switching element to an OFF state, and
supply the second sense terminal with the second target voltage by controlling the first switching element, the second switching element, and the fifth switching element to an OFF state, and controlling the fourth switching element to an ON state.

* * * * *